US009741956B2

(12) United States Patent
Tsai et al.

(10) Patent No.: US 9,741,956 B2
(45) Date of Patent: Aug. 22, 2017

(54) ORGANIC LIGHT-EMITTING DIODE APPARATUS

(71) Applicant: Industrial Technology Research Institute, Hsinchu (TW)

(72) Inventors: Cheng-Yen Tsai, Keelung (TW); Chih-Ming Lai, Changhua County (TW); Wen-Yung Yeh, Hsinchu County (TW); Hsuan-Yu Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 4 days.

(21) Appl. No.: 14/864,910

(22) Filed: Sep. 25, 2015

(65) Prior Publication Data

US 2016/0148560 A1    May 26, 2016

Related U.S. Application Data

(60) Provisional application No. 62/084,524, filed on Nov. 25, 2014.

(30) Foreign Application Priority Data

Jun. 30, 2015  (TW) .............................. 104121018 A

(51) Int. Cl.
*H05B 37/02* (2006.01)
*H01L 51/50* (2006.01)
(Continued)

(52) U.S. Cl.
CPC .............. *H01L 51/504* (2013.01); *F21K 9/00* (2013.01); *H01L 27/3269* (2013.01); *H01L 51/5278* (2013.01)

(58) Field of Classification Search
CPC .. G09G 3/3413; G09G 3/3233; G09G 3/3406; H01L 51/5016; H01L 51/5004; H04N 13/0003; F21K 9/00; H05B 33/0896
(Continued)

(56) References Cited

U.S. PATENT DOCUMENTS 5,707,745 A   1/1998 Forrest et al.
5,757,026 A   5/1998 Forrest et al.
(Continued)

FOREIGN PATENT DOCUMENTS

CN   101364380   2/2009
TW   200626009   7/2006
(Continued)

OTHER PUBLICATIONS

"Office Action of Taiwan Counterpart Application", issued on Jun. 27, 2016, p. 1-p. 18.
(Continued)

*Primary Examiner* — Nicholas Lee
*Assistant Examiner* — Abdul-Samad A Adediran
(74) *Attorney, Agent, or Firm* — Jianq Chyun IP Office

(57) ABSTRACT

An organic light-emitting diode (OLED) apparatus includes at least one OLED illumination module, a driving unit, an optical sensing module, a control unit, and a storage unit. The driving unit is configured to adjust voltage applied to the OLED illumination module, so as to change a CCT of the OLED illumination module. The optical sensing module is configured to sense the light emitted by the OLED illumination module. The control unit is configured to receive a feedback signal from the optical sensing module so as to adjust a light intensity and the CCT of the OLED illumination module. The storage unit is configured to store photoelectric parameter data of the OLED illumination module. The control unit is configured to adjust the CCT and the light
(Continued)

intensity of the OLED illumination module to target values according to the photoelectric parameter data.

21 Claims, 22 Drawing Sheets

(51) Int. Cl.
*F21K 9/00* (2016.01)
*H01L 27/32* (2006.01)
*H01L 51/52* (2006.01)

(58) Field of Classification Search
USPC .......... 257/40; 315/185 R, 192; 345/76, 207; 348/43; 349/69; 428/704
See application file for complete search history.

(56) References Cited

U.S. PATENT DOCUMENTS

| | | |
|---|---|---|
| 6,819,036 B2 | 11/2004 | Cok |
| 7,598,686 B2 | 10/2009 | Lys et al. |
| 7,626,342 B2 | 12/2009 | Sun et al. |
| 7,638,754 B2 | 12/2009 | Morimoto et al. |
| 7,796,098 B2 | 9/2010 | Masumoto et al. |
| 7,906,900 B2 | 3/2011 | Song et al. |
| 7,939,793 B2 | 5/2011 | Rains, Jr. et al. |
| 7,977,872 B2 | 7/2011 | Spindler et al. |
| 7,978,743 B2 | 7/2011 | Deppe et al. |
| 8,154,214 B2 | 4/2012 | Kuroki et al. |
| 8,222,806 B2 | 7/2012 | Jou et al. |
| 8,334,659 B2 | 12/2012 | Aurongzeb et al. |
| 8,587,215 B2 | 11/2013 | Roberts et al. |
| 8,749,166 B2 | 6/2014 | Verschuren |
| 8,772,691 B2 | 7/2014 | May et al. |
| 8,783,935 B2 | 7/2014 | Lee et al. |
| 8,801,220 B2 | 8/2014 | Chung |
| 9,488,320 B1* | 11/2016 | Palfreyman ............... F21K 9/00 |
| 2007/0291198 A1* | 12/2007 | Shen .................... G09G 3/3413 349/69 |
| 2008/0170004 A1* | 7/2008 | Jung .................... G09G 3/3233 345/76 |
| 2008/0286610 A1* | 11/2008 | Deaton ............... H01L 51/5016 428/704 |
| 2009/0033646 A1* | 2/2009 | Liu ...................... G09G 3/3406 345/207 |
| 2011/0032328 A1* | 2/2011 | Raveendran ....... H04N 13/0003 348/43 |
| 2012/0280631 A1* | 11/2012 | Burrows ................... F21K 9/00 315/192 |
| 2013/0002154 A1* | 1/2013 | Choi .................. H05B 33/0896 315/185 R |
| 2013/0256637 A1* | 10/2013 | Seo ..................... H01L 51/5004 257/40 |
| 2013/0307419 A1 | 11/2013 | Simonian et al. |

FOREIGN PATENT DOCUMENTS

| | | |
|---|---|---|
| TW | 200809721 | 2/2008 |
| TW | I310251 | 5/2009 |
| TW | I378985 | 12/2012 |
| TW | 201427491 | 7/2014 |
| TW | 201431853 | 8/2014 |

OTHER PUBLICATIONS

Velve OLED lighting, Mitsubishi chemical Corporation, Sep. 2011, pp. 1-2.
"Color-Tunable OLED", Fraunhofer Research Institution for Organics, Materials and Electronic Devices COMEDD, LOPE-C, Jun. 2013, pp. 1-2.
Yuan-Sheng Tyan, "Organic light-emitting-diode lighting overview", Journal of Photonics for Energy, Jan. 20, 2011, pp. 1-15.
Jou et al., "Sunlight-style color-temperature tunable organic light-emitting diode", Applied Physics Letters, Jul. 10, 2009, pp. 1-3.
Sasabe et al., "High-Efficiency Blue and White Organic Light-Emitting Devices Incorporating a Blue Iridium Carbene Complex", Adv. Mater., Sep. 2010, pp. 5003-5007.
Chiba et al., "Ultra-high efficiency by multiple emission from stacked organic light-emitting devices", Organic Electronics, Feb. 23, 2011, pp. 710-715.
Weichsel et al., "Organic light-emitting diodes for lighting: High color quality by controlling energy transfer processes in host-guest-systems", Journal of Applied Physics, Feb. 2012, pp. 1-7.
Niu et al., "Design of LED Street Lamps Intelligent Control System Based on PIC MCU", IEEE, Nov. 2012, pp. 1-4.
Ashibe et al., "Distributed Optimization Algorithm for Lighting Color Control using Chroma Sensors", 2008 IEEE, Oct. 2008, pp. 174-178.
Sung et al., "Adaptive weighted data fusion of wisdom LED Lighting Control System Design and Research", 2014 IEEE, Jun. 2014, pp. 426-429.
Qu et al., "Color Control System for RGB LED Light Sources Using Junction Temperature Measurement", 2007 IEEE, Nov. 2007, pp. 1363-1368.
Han et al, "Design of an Intelligent White-OLED Lighting System using Power Line Communication", 2012 IEEE, Apr. 2012, pp. 3191-3194.

* cited by examiner

ORGANIC LIGHT-EMITTING DIODE APPARATUS

CROSS-REFERENCE TO RELATED APPLICATION

This application claims the priority benefits of U.S. provisional application Ser. No. 62/084,524, filed on Nov. 25, 2014 and Taiwan application serial no. 104121018, filed on Jun. 30, 2015. The entirety of each of the above-mentioned patent applications is hereby incorporated by reference herein and made a part of this specification.

TECHNICAL FIELD

The technical field relates to an organic light-emitting diode (OLED) apparatus.

BACKGROUND

Since an organic light-emitting diode (OLED) element has Lambertian planar light source characteristic, light intensity thereof from any point view is soft. In addition, the OLED element has advantages of having high color rendering index, adjustable brightness and color temperature, no mercury hazard during processing, no UV radiation, low blue-light hazard, low heat, low operation voltage, instant lighting, rapid reaction, luminous uniformity without glare, and thin and lightweight in coordination with a flexible substrate, and capable of being made into any shape with interior design. How to bring out natural, environmental friendly and harmless advantages of OLED illumination is a business developmental direction for distinguishing the OLED illumination from other illumination technologies.

The development of OLED illumination is generally considered not for replacing light-emitting diode (LED) illumination. Although the OLED illumination at the current stage has yet to be improved in terms of cost and lifespan, it has numerous benefits of planar light source, and can play to its strengths in illumination applications with particular features, such as home, shopping store, hotel, building, and so forth. Therefore, the development of OLED illumination technology can only be further promoted by bringing out the features of the OLED illumination through the coordination between three technical fields: (1) OLED element design, (2) driving circuit design of lighting, and (3) ingenious lighting design of lighting manufacturer, and thus the market share thereof in the field of lighting industry can be expanded. Accordingly, in terms of practical application design, how to match a user's theme with a coordination between the driving circuit design and the design of white light OLED element, in addition to general demands of changing light emission brightness and requiring steady light emitting color temperature, enabling the OLED illumination module to switch between different light emitting color temperatures, and/or enabling the OLED to emit light with characteristics of non-periodic color temperature and brightness are all being concerned for practical opportunities.

SUMMARY

An exemplary embodiment provides an organic light-emitting diode (OLED) apparatus including at least one OLED illumination module, a driving unit, an optical sensing module, a control unit, and a storage unit. The driving unit is electrically connected to the OLED illumination module and configured to adjust voltage applied to the OLED illumination module, so as to change a correlated color temperature (CCT) of light emitted by the OLED illumination module. The optical sensing module is configured to sense the light emitted by the OLED illumination module. The control unit is configured to receive a feedback signal from the optical sensing module so as to adjust a light intensity and the CCT of the OLED illumination module. The light intensity and the CCT of the OLED illumination module is adjusted by adjusting the voltage and a duty cycle of a pulse wavelength modulation (PWM) to the OLED illumination module. The storage unit is configured to store photoelectric parameter data of the OLED illumination module. The control unit is configured to adjust the CCT and the light intensity of the OLED illumination module to target values according to the photoelectric parameter data.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
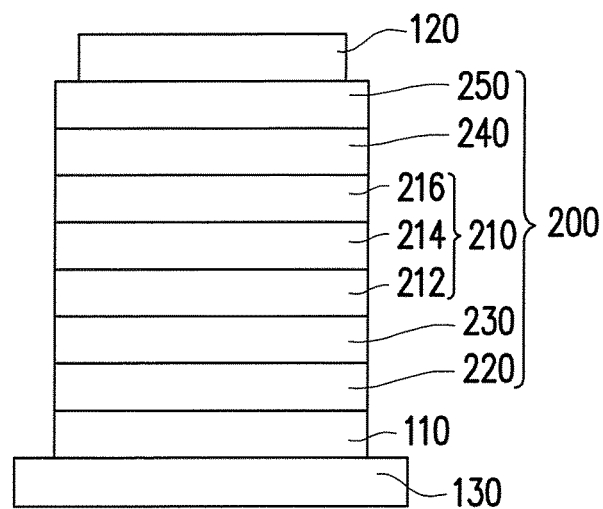
FIG. 1A is a schematic cross-sectional view illustrating an organic light-emitting diode (OLED) illumination module according to an embodiment of the disclosure.
Figure 1B:
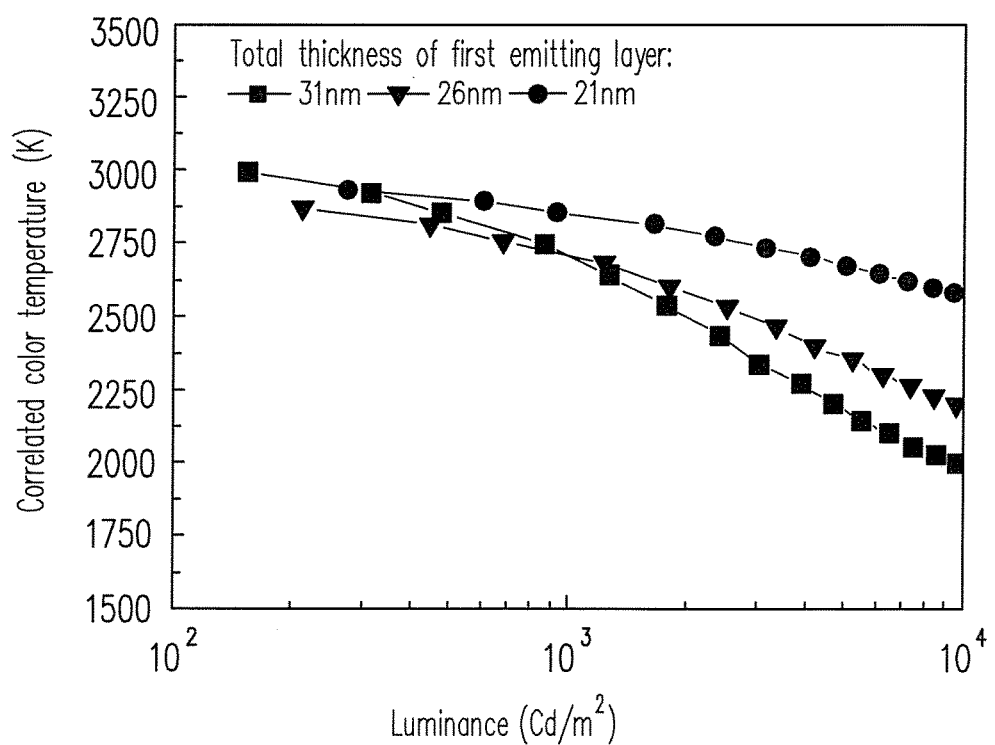
FIG. 1B is a variation graph of correlated color temperatures (CCTs) of lights emitted by the OLED illumination module of FIG. 1A in relative to luminance under different emitting layer thickness.

FIG. 1A is a schematic cross-sectional view illustrating an organic light-emitting diode (OLED) illumination module according to an embodiment of the disclosure, and FIG. 1B is a variation graph of correlated color temperatures (CCTs) of lights emitted by the OLED illumination module of FIG. 1A in relative to luminance under different emitting layer thickness. Referring to FIG. 1A and FIG. 1B, the OLED illumination module 100 of the present embodiment includes a first electrode 110, a second electrode 120 and an OLED layer stack 200. The OLED layer stack 200 is disposed between the first electrode 110 and the second electrode 120, and includes a first emitting layer 210 and at least one of a hole injection layer, a hole transport layer, an electron injection layer, an electron transport layer and a blocking layer. In the present embodiment, the OLED layer stack 200 includes a hole injection layer 220, a hole transport layer 230, a first emitting layer 210, an electron transport layer 240 and an electron injection layer 250 sequentially stacked from the first electrode 110 to the second electrode 120. In the present embodiment, the first electrode 110 can be formed on a substrate 130.

In the present embodiment, the first emitting layer 210 includes a plurality of emitting sub-layers of various different colors. For instance, the first emitting layer 210 may include an emitting sub-layer 212, an emitting sub-layer 214 and an emitting sub-layer 216, wherein the emitting sub-layer 212, the emitting sub-layer 214 and the emitting sub-layer 216 are, for example, respectively a blue emitting sub-layer, a red emitting sub-layer and a yellow emitting sub-layer. The first emitting layer 210 that includes the emitting sub-layer 212, the emitting sub-layer 214 and the emitting sub-layer 216 can emit white light. In the present embodiment, a total thickness of the first emitting layer 210 is increased. The total thickness of the first emitting layer 210 may range from 20 nm to 45 nm. As a result, a moving range of the recombination center of the excitons (i.e., electron-hole pair) for emitting light in the first emitting layer 210 is widened, so the luminescent center tends to stay at a certain emitting sub-layer 212, 214, 216 of certain color. For instance, when the luminescent center stays at the red emitting sub-layer 214 or the yellow emitting sub-layer 216, the light emitted by the OLED illumination module 100 has a lower color temperature, and when the luminescent center stays at the blue emitting sub-layer 212, the light emitted by the OLED illumination module 100 has a higher color temperature. In addition, the location of the luminescent center is related to a difference between the voltages applied to the first electrode 110 and the second electrode 120, and the greater the voltage difference being applied, the larger the light intensity (e.g., luminance) of the light emitted by the OLED illumination module 100. It can be known from FIG. 1B that, when the total thickness of the first emitting layer 210 gets thicker, a variation range of color temperature with the variation of the luminance or the difference between the applied voltages gets bigger. If thicknesses of the emitting sub-layers of various colors in the emitting layer 210 are shrunk to 0.8 times or 0.7 times in equal proportion, the variation range of the color temperature with the variation of the luminance (or the difference between the applied voltages) would also be reduced.

In other words, the OLED layer stack 200 has an electro-optic characteristic, such that when a voltage difference between the first electrode 110 and the second electrode 120 is increased or decreased, both a light intensity (e.g., luminance) and a correlated color temperature (CCT) of the light emitted by the OLED layer stack 200 are varied.

Figure 2A:
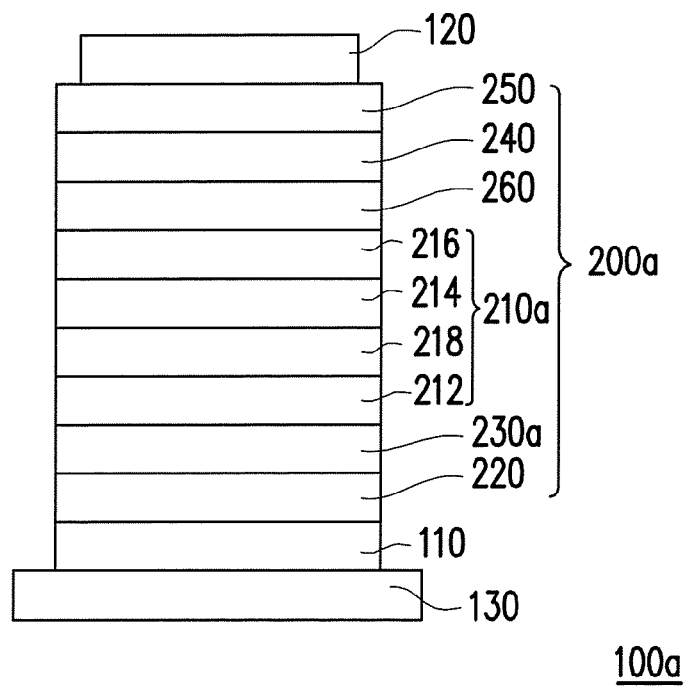
FIG. 2A is a schematic cross-sectional view illustrating an OLED illumination module according to another embodiment of the disclosure.
Figure 2B:
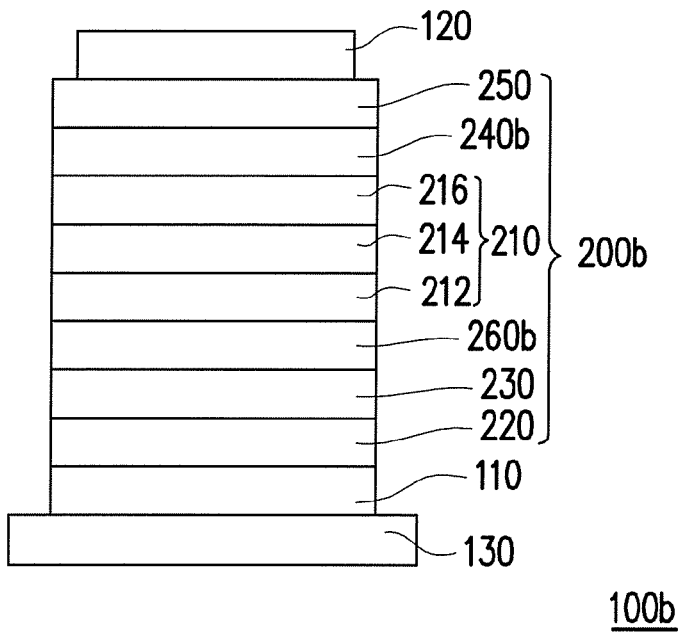
FIG. 2B is a variant of the OLED illumination module of FIG. 2A.
Figure 3:
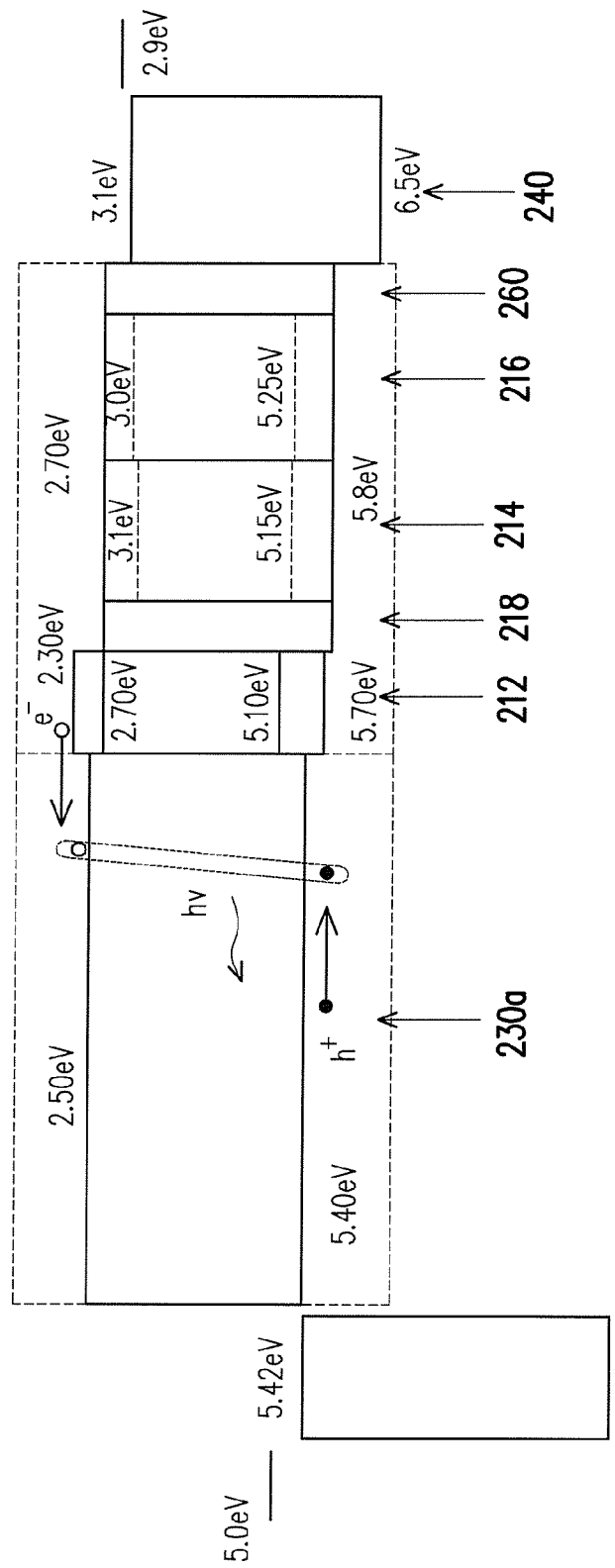
FIG. 3 is an energy band diagram of the OLED illumination module of FIG. 2A.

FIG. 2A is a schematic cross-sectional view illustrating an OLED illumination module according to another embodiment of the disclosure, FIG. 2B is a variant of the OLED illumination module of FIG. 2A, and FIG. 3 is an energy band diagram of the OLED illumination module of FIG. 2A. Referring to FIG. 2A and FIG. 3, an OLED illumination module 100a of the present embodiment is similar to the OLED illumination module 100 of FIG. 1A, wherein differences between the two are described as follows. In an OLED illumination module 100a of the present embodiment, an OLED layer stack 200a includes a blocking layer 260, and the blocking layer 260 is disposed at a first side of a first emitting layer 210a (e.g., a side close to the second electrode 120). The OLED layer stack 200a further includes a second emitting layer, a hole transport layer 230a capable of emitting light or an electron transport layer capable of emitting light (in the present embodiment, the hole transport layer 230a capable of emitting light is exemplarily adopted) disposed at a second side of the first emitting layer 210a (e.g., a side close to the first electrode 110), wherein the first side is opposite to the second side. In addition, a thickness of the first emitting layer 210a ranges from 20 mm to 45 nm. In the present embodiment, the first emitting layer 210a further includes a blocking layer 218 disposed between the emitting sub-layer 212 and the emitting sub-layer 214.

In the present embodiment, the hole transport layer 230a capable of emitting blue light or green light is used, wherein a main wavelength of the light emitted thereby is, for example, ranging from blue band to green band (e.g., 460 nm to 530 nm). When the voltage and the current applied to the OLED illumination module are increased, the excitons are spread to the hole transport layer 230a to emit the blue light or the green light, and thus the correlated color temperature (CCT) of the light emitted by the OLED illumination module is increased. In addition, when the first emitting layer 210a emits light while the hole transport layer 230a does not emit light, the color rendering index Ra is greater than 60. However, when both the first emitting layer 210a and the hole transport layer 230a emit light, the color rendering index Ra is greater than 75. Hence, the hole transport layer 230a can effectively increase the color rendering index. In an example that the hole transport layer emits the light, a lowest unoccupied molecular orbital (LUMO) of the hole transport layer 230a and a lowest unoccupied molecular orbital of the emitting layer 210a are decreased, and thus electrons can be injected into the hole transport layer 230a and form into excitons with the holes, so as to emit light. In terms of the hole transport layer 230a capable of emitting light, a main wavelength of the light emitted thereby ranges from 460 nm to 530 nm, namely, from the blue band to the green band. In addition, a dopant capable of emitting blue light, green light or a combination thereof (e.g., fluorescent dopant) can be doped into the hole transport layer, so as to enhance a quantum efficiency.

In the present embodiment, a hole barrier between the hole transport layer 230a capable of emitting light and the first emitting layer 210a is smaller than 0.3 eV, so the holes can be injected into the hole transport layer 230a capable of emitting light.

In FIG. 3, an upper horizontal line represents a lowest unoccupied molecular orbital of the corresponding layer, and a lower horizontal line represents a highest occupied molecular orbital of the corresponding layer. In addition, the first emitting layer 210a including the emitting sub-layers 212, 214 and 216 can emit white light. When a lower voltage difference is applied to the OLED illumination module 100a, the first emitting layer 210a emits white light, but the hole transport layer 230a does not emit light. When a higher voltage difference is applied to the OLED illumination module 100a, the first emitting layer 210a emits white light, and the hole transport layer 230a emits green light, blue light or a combination thereof, and thus a CCT of the light emitted by the OLED illumination module 100a can be increased. When a voltage applied to the OLED illumination module changes from 2.5 V to 8 V, a variation range of the CCT ranges from 2000 K to 7000 K. Moreover, in the present embodiment, the blocking layer 260 is a hole blocking layer or an exciton blocking layer, so the excitons can emit light at a side of the blocking layer 260 close to the first electrode 110.

Referring to an OLED illumination module 100b of FIG. 2B, it is similar to the OLED illumination module 100a of FIG. 2A, wherein differences between the two are described as follows. In an OLED illumination module 100b of the present embodiment, the first side of the first emitting layer 210 at which a blocking layer 260b is disposed is a side of the first emitting layer 210 close to the first electrode 110, and the OLED layer stack 200b further includes a second emitting layer, a hole transport layer capable of emitting light or an electron transport layer 240b capable of emitting light (in the present embodiment, the electron transport layer 240b capable of emitting light is exemplarily adopted) disposed at a second side of the first emitting layer 210 (e.g., a side close to the second electrode 110).

In an example that the electron transport layer 240b can emit the light, a difference between a highest occupied molecular orbital of the first emitting layer 210 and a highest occupied molecular orbital of the electron transport layer 240b is reduced, and thus the holes can be injected into the electron transport layer 240b and be combined with the electrons, so as to emit light. In the present embodiment, an electron barrier between the electron transport layer 240b capable of emitting light and the first emitting layer 210 is smaller than 0.3 eV, so the electrons can be injected into the electron transport layer 240b capable of emitting light. In terms of the electron transport layer 240b capable of emitting light, a main wavelength of the light emitted thereby ranges from 460 nm to 530 nm, namely, from the blue band to the green band. In addition, a dopant capable of emitting blue light, green light or a combination thereof (e.g., fluo- rescent dopant) can be doped into the electron transport layer 240b, so as to enhance a quantum efficiency. In the present embodiment, the blocking layer 260b is, for example, an electron blocking layer or an exciton blocking layer, so the excitons can emit light at a side of the blocking layer 260b close to the second electrode 120. In addition, the first emitting layer 210 can emit white light, and when the electron transport layer 240b emits light, a CCT of the overall OLED illumination module 100b can be increased. In the present embodiment, when the first emitting layer 210 emits light while the electron transport layer 240b does not emit light, the color rendering index Ra is greater than 60. However, when both the first emitting layer 210 and the electron transport layer 240b emit light, the color rendering index Ra is greater than 75. Hence, the electron transport layer can increase a color rendering index of the overall OLED illumination module 100b.

In the embodiments of FIG. 2A and FIG. 2B, the blocking layer 260 (or 260b) is located at a single side of the first emitting layer 210a (or 210), and another side of the first emitting layer 210a (or 210) is disposed with another layer capable of emitting light for modulating color temperature; and thus, the OLED illumination modules 100a and 100b can achieve an effect of modulating the CCT and the light intensity by varying the applied voltage.

Figure 4:
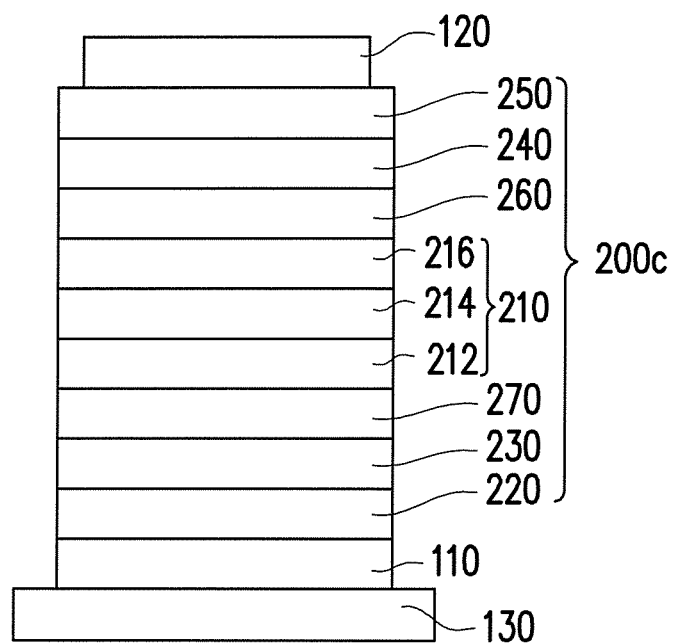
FIG. 4 is a schematic cross-sectional view illustrating an OLED illumination module according to yet another embodiment of the disclosure.

FIG. 4 is a schematic cross-sectional view illustrating an OLED illumination module according to yet another embodiment of the disclosure. Referring to FIG. 4, an OLED illumination module 100c of the present embodiment is similar to the OLED illumination module 100a of FIG. 2A, wherein differences between the two are described as follows. The OLED illumination module 100c of the present embodiment further includes a second emitting layer 270 disposed at the second side of the first emitting layer 210 (i.e., the side close to the first electrode 110). The second emitting layer 270 can emit light having a main wavelength ranging from blue band to green band. In the present embodiment, the emitting sub-layer 212 of the first emitting layer 210 can emit blue light, and the second emitting layer 270 may also emit the blue light. In the present embodiment, the blue emitting sub-layer 212 has a lower start-up driving voltage, and the second emitting layer 270 has a higher start-up driving voltage. In the present embodiment, the start-up driving voltage of the second emitting layer 270 is higher than the start-up driving voltage of the emitting sub-layer 212 capable of emitting blue light by at least 0.5 volts (V). Therefore, as a voltage difference applied to the OLED illumination module 100c gradually increases, the first emitting layer 210 emits white light first, and the first emitting layer 210 and the second emitting layer 270 then together emit lights. When the second emitting layer 270 emits the blue light, a CCT of the light emitted by the OLED illumination module 100c can be increased.

In the present embodiment, the second emitting layer 270 has an electron vibronic emission characteristic (i.e., a spectrum thereof has two peaks), and wavelengths of the two peaks of the spectrum of electron vibronic emission range from 450 to 475 nm and from 475 to 500 nm, respectively. In addition, the blue emitting sub-layer 212 can have no electron vibronic emission characteristic. Since the second emitting layer 270 has the electron vibronic emission characteristic (i.e., the spectrum thereof has two peaks), when the CCT of the OLED illumination module 100c is increased, the electron vibronic emission can enable the light emitted by the organic light-emitting diode 100c to maintain a high color rendering index (CRI).

Figure 5:
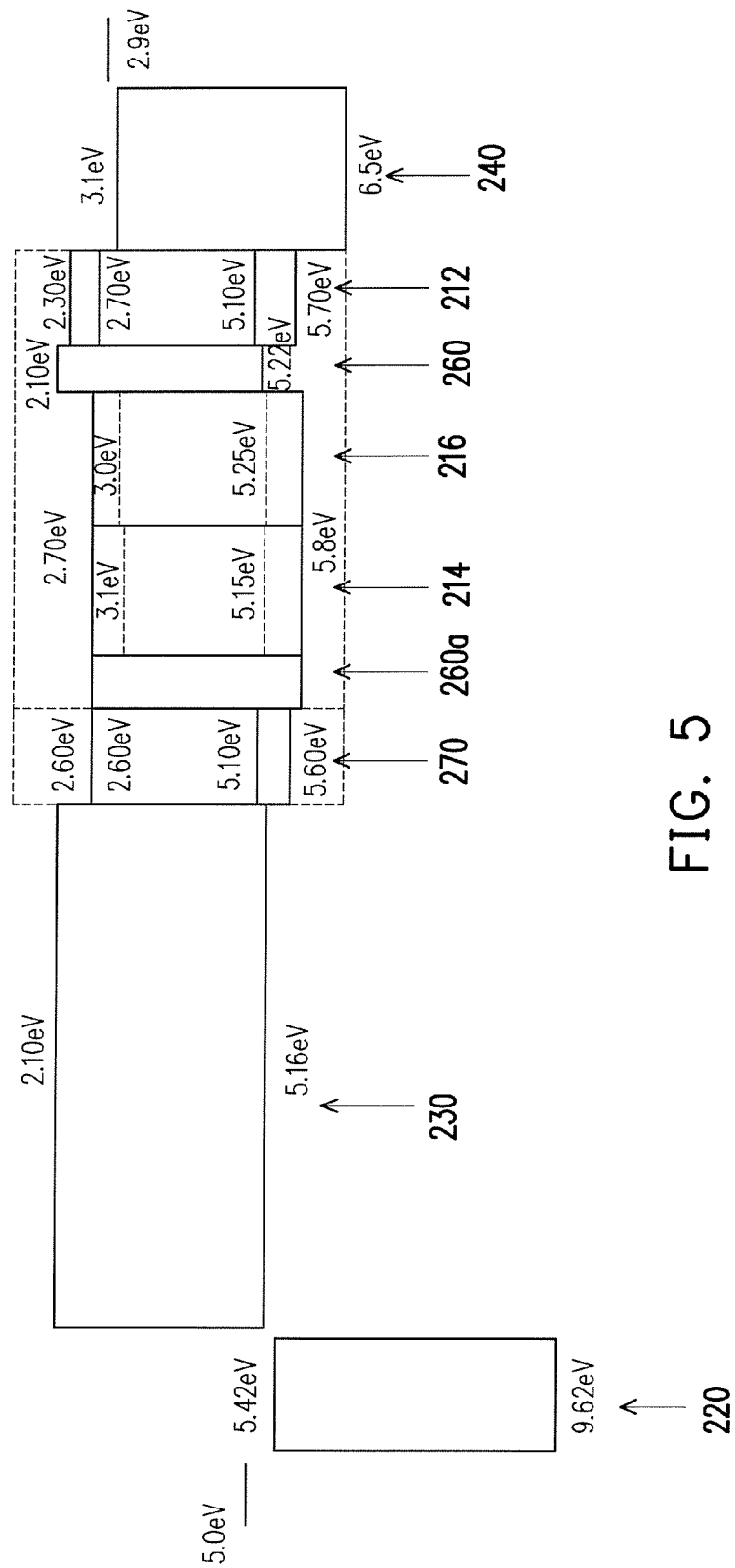
FIG. 5 is an energy band diagram of an OLED illumination module similar to that of FIG. 4.

FIG. 5 is an energy band diagram of an OLED illumination module similar to that of FIG. 4. Referring to FIG. 5, in the OLED illumination module of the present embodiment, a blocking layer 260a is disposed between the second emitting layer 270 and the emitting sub-layer 214, and another blocking layer 260 is disposed between the emitting sub-layer 216 and the emitting sub-layer 212. When the emitting sub-layers 212, 214 and 216 emit lights to be mixed into white light, the color rendering index Ra is greater than 60. When the emitting sub-layers 212, 214 and 216 emit lights and the second emitting layer 270 emits light, the overall color rendering index Ra is greater than 75. Accordingly, the electron vibronic emission characteristic of the second emitting layer 270 can effectively increase the color rendering index.

Figure 6:
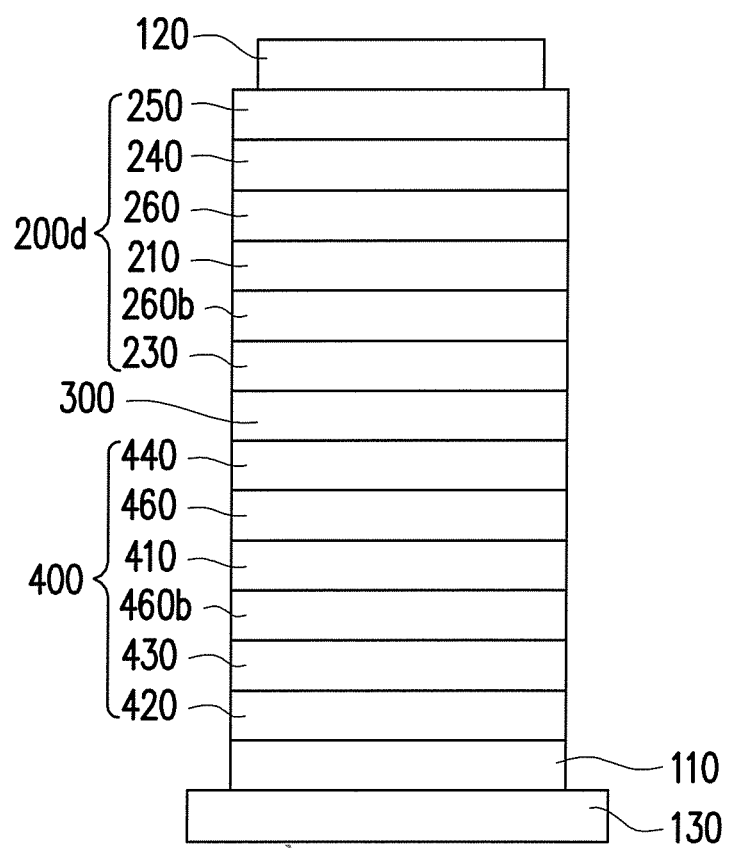
FIG. 6 is a schematic cross-sectional view illustrating an OLED illumination module according to still another embodiment of the disclosure.
Figure 7A:
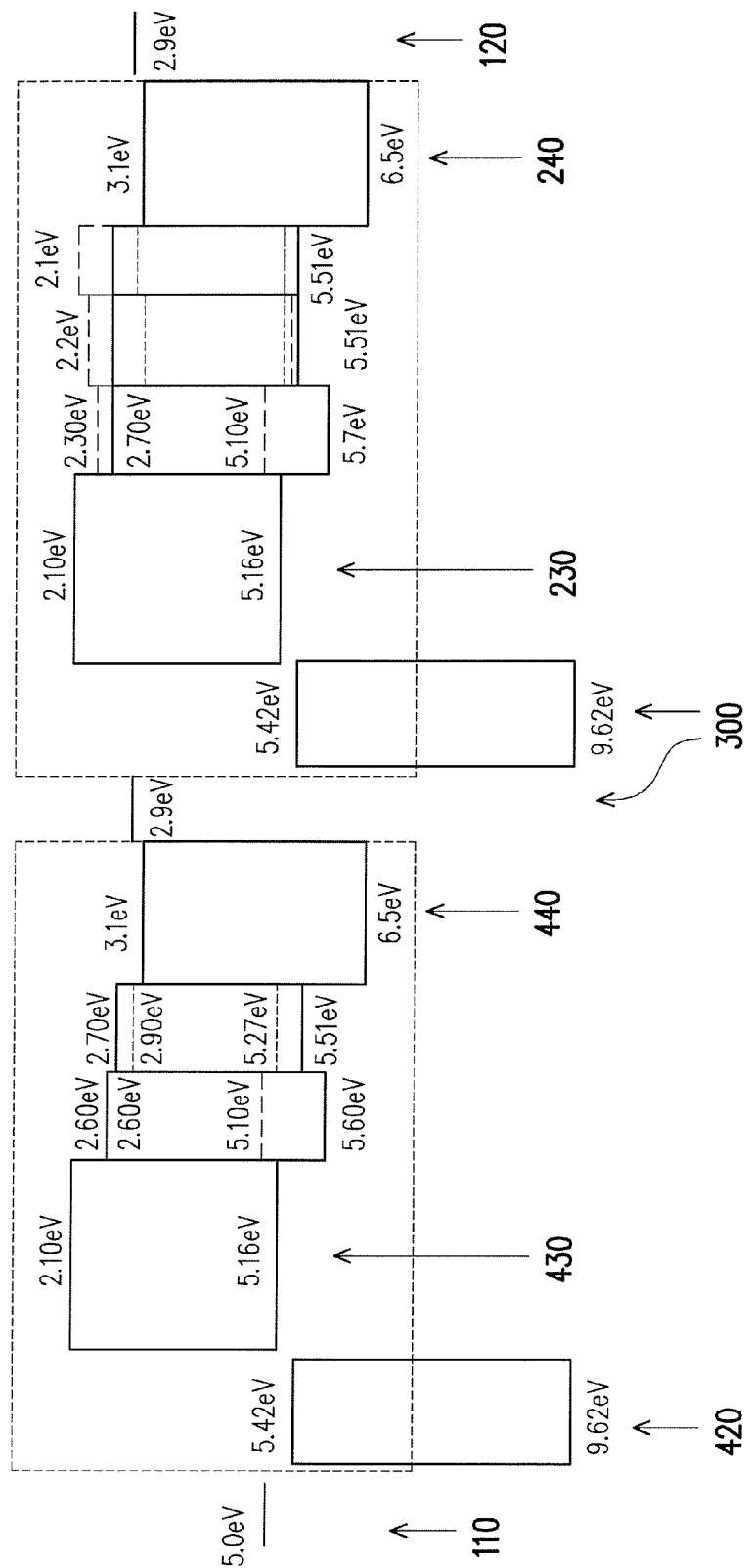
FIG. 7A, FIG. 7B and FIG. 7C are energy band diagrams for three variants of the OLED illumination module of FIG. 6.
Figure 7B:
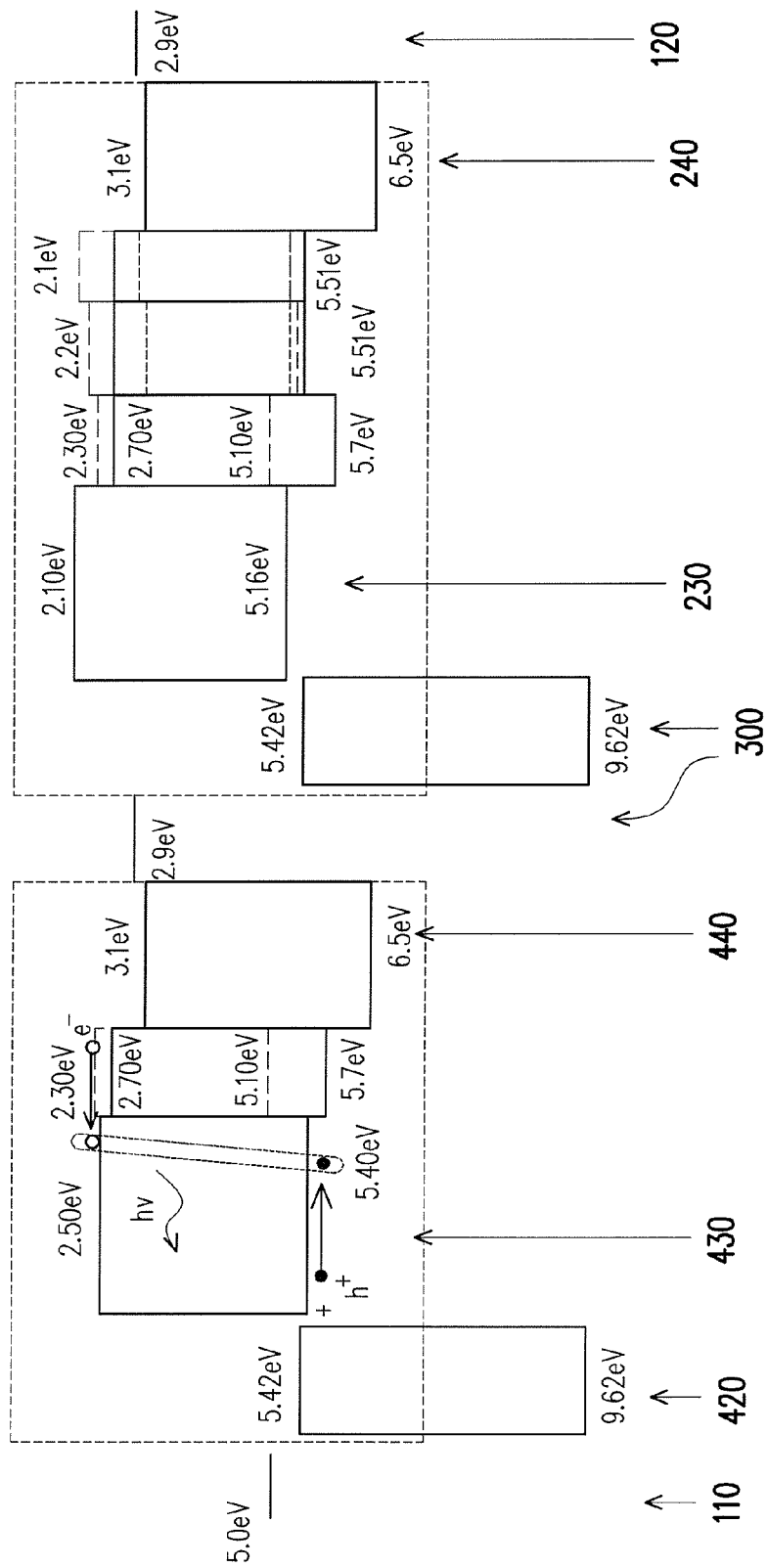
Figure 7C:
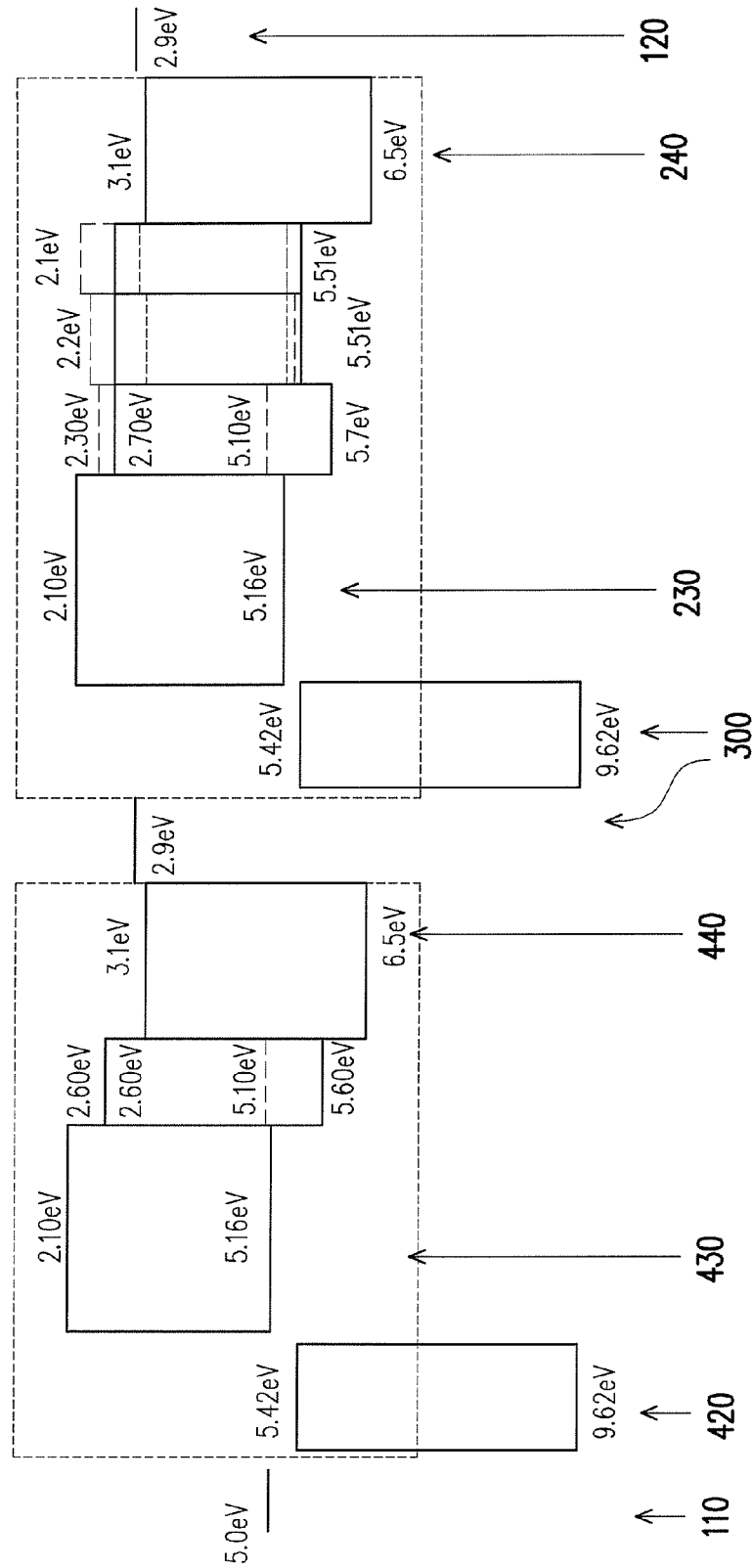

FIG. 6 is a schematic cross-sectional view illustrating an OLED illumination module according to still another embodiment of the disclosure, and FIG. 7A, FIG. 7B and FIG. 7C are energy band diagrams for three variants of the OLED illumination module of FIG. 6. Referring to FIG. 6 and FIG. 7A through FIG. 7C, an OLED illumination module 100d of the present embodiment is similar to the OLED illumination modules 100a and 100b of FIG. 2A and FIG. 2B, wherein main differences therebetween are described as follows. The OLED illumination module 100d of the present embodiment further includes another OLED layer stack 400 and a charge generation layer (CGL) 300. The charge generation layer 300 is disposed between two adjacent OLED layer stacks 200d and 400. In other words, the OLED illumination module 100d of the present embodiment is a tandem OLED illumination module.

The another OLED layer stack 400 includes a second emitting layer 410 and at least one of a hole injection layer, a hole transport layer, an electron injection layer, an electron transport layer and a blocking layer. In the present embodiment, the OLED layer stack 200d includes the hole transport layer 230, the blocking layer 260b, the first emitting layer 210, the blocking layer 260, the electron transport layer 240 and the electron injection layer 250 sequentially stacked from the charge generation layer 300 to the second electrode 120, and the OLED layer stack 400 includes the hole injection layer 420, the hole transport layer 430, the blocking layer 460b, the second emitting layer 410, the blocking layer 460 and the electron transport layer 440 sequentially stacked from the first electrode 110 to the charge generation layer 300.

In the present embodiment, when an appropriate voltage is applied to the tandem OLED illumination module 100d, the holes and the electrons in the charge generation layer 300 are separated, wherein the holes are injected into the hole transport layer 230 of the OLED layer stack 200d, and the electrons are injected into the electron transport layer 440 of the OLED layer stack 400.

In the present embodiment, the first emitting layer 210 is, for example, a full phosphorescent emitting layer, a hybrid blue, red, and yellow (BRY) emitting layer, a hybrid blue, red, and green (BRG) emitting layer or a hybrid blue, red, yellow, and green (BRYG) emitting layer that is capable of emitting white light. The full phosphorescent light emitting layer means that all the emitting sub-layers, of various colors including blue color, of the first emitting layer 210 emit phosphorescence, and the hybrid BRY emitting layer, the hybrid BRG emitting layer or the hybrid BRYG emitting layer means that the blue emitting sub-layer emits fluorescence while the all emitting sub-layers of other colors emit phosphorescence.

In the present embodiment, the second emitting layer 410 can emit blue light and green light, or can emit blue light. In addition, a start-up driving voltage of the first emitting layer 210 of the OLED layer stack 200d is lower than a start-up driving voltage of the second emitting layer 410 of the OLED layer stack 400 by, for example, at least 0.5 V. Therefore, when the voltage or current applied to the OLED illumination module 100d gradually increases, the first emitting layer 210 lights up first, and the second emitting layer 410 then lights up to increase the CCT of the light emitted by the OLED illumination module 100d. Moreover, in the present embodiment, when the first emitting layer 210 emits light while the second emitting layer 410 does not emit light, the color rendering index Ra is greater than 60. When both the first emitting layer 210 and the second emitting layer 410 emit light, the color rendering index Ra is greater than 75. Accordingly, that the second emitting layer 410 can effectively increase the color rendering index.

In addition, in one embodiment, a material of the hole transport layer 430 of the OLED layer stack 400 can be a luminescent material capable of emitting light having a main wavelength ranging from the blue band to the green band (e.g., the wavelength ranging from 450 nm to 530 nm). Moreover, in the present embodiment, the OLED layer stack 400 with higher start-up driving voltage may be obtained by selecting the hole transport layer or the electron transport layer with lower carrier mobility.

Figure 8:
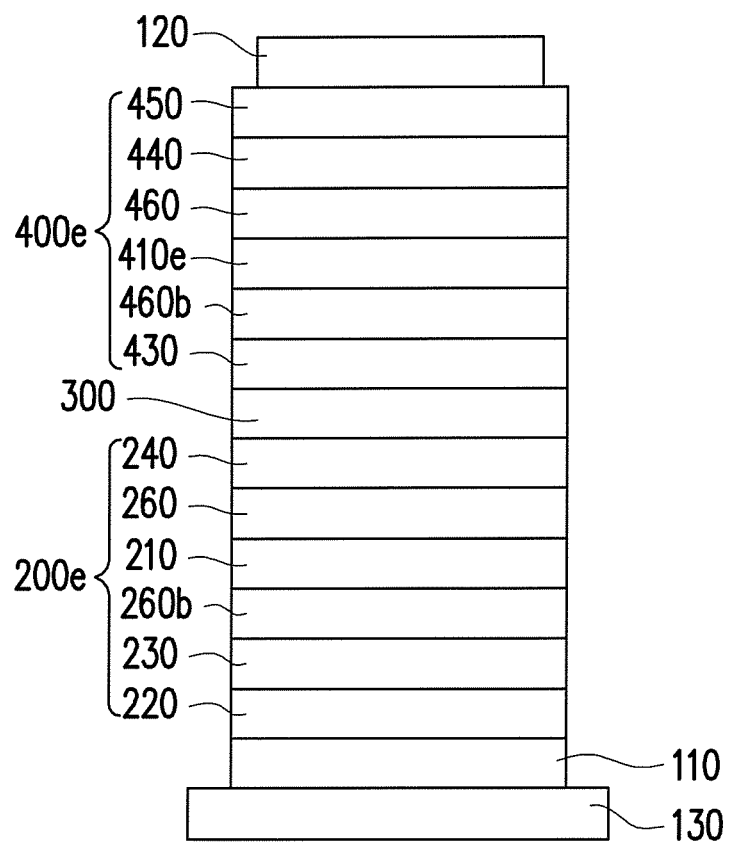
FIG. 8 is a schematic cross-sectional view illustrating an OLED illumination module according to another embodiment of the disclosure.
Figure 9:
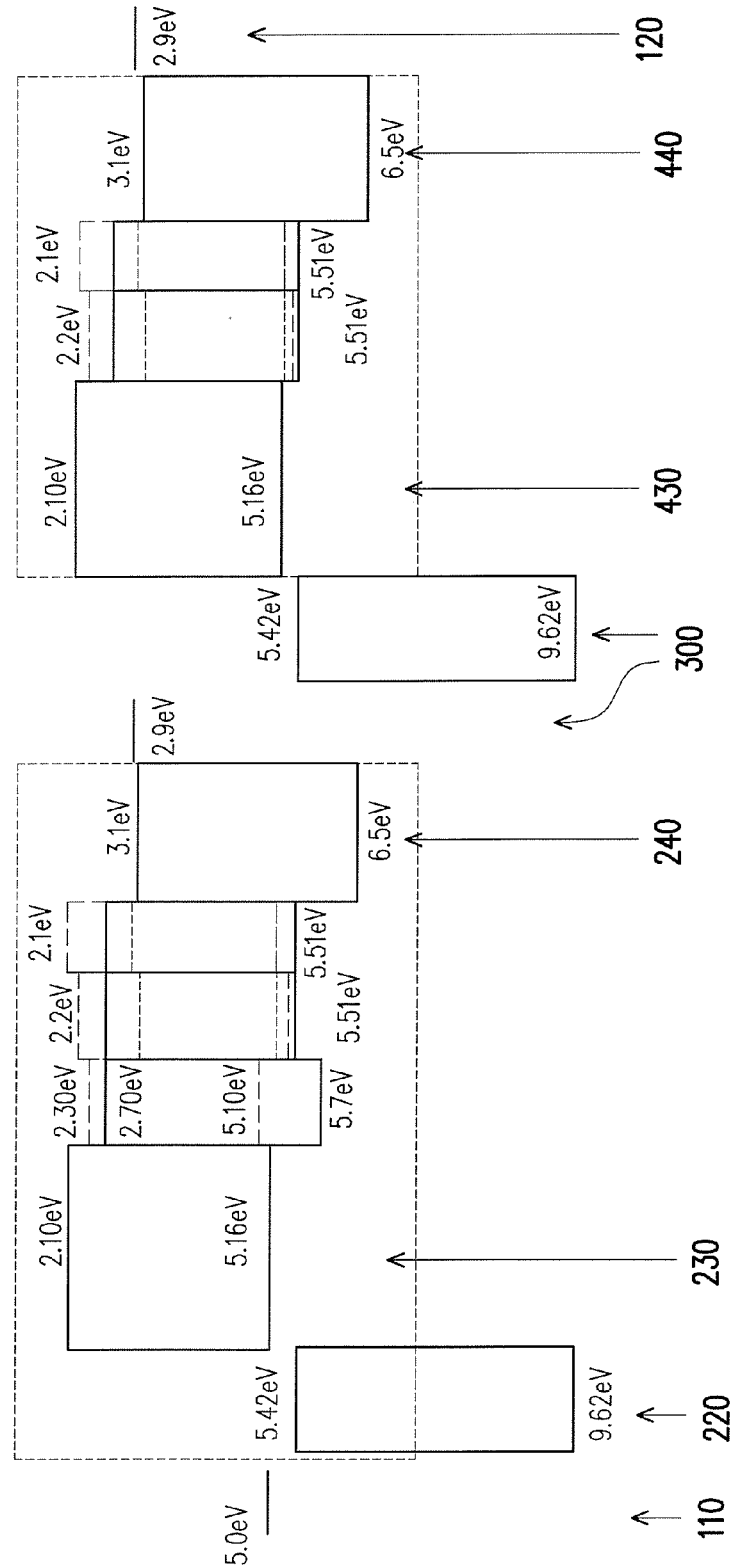
FIG. 9 is an energy band diagram for a variant of the OLED illumination module of FIG. 8.

FIG. 8 is a schematic cross-sectional view illustrating an OLED illumination module according to another embodiment of the disclosure, and FIG. 9 is an energy band diagram for a variant of the OLED illumination module of FIG. 8. Referring to FIG. 8 and FIG. 9, an OLED illumination module 100e of the present embodiment is similar to the OLED illumination module 100d of FIG. 6, wherein main differences between the two are described as follows. In the present embodiment, a second emitting layer 410e of the OLED layer stack 400e can emit red light, or emit red light and yellow light. For instance, the second emitting layer 410e can emit red phosphorescence, or emit red phosphorescence and yellow phosphorescence.

In the present embodiment, the OLED layer stack 200e is disposed between the first electrode 110 and the charge generation layer 300, and includes the hole injection layer 220, the hole transport layer 230, the blocking layer 260b, the first emitting layer 210, the blocking layer 260 and the electron transport layer 240 sequentially stacked from the first electrode 110 to the charge generation layer 300. In addition, the OLED layer stack 400e is disposed between the charge generation layer 300 and the second electrode 120, and includes the hole transport layer 430, the blocking layer 460b, the second emitting layer 410e, the blocking layer 460, the electron transport layer 440 and the electron injection layer 450 sequentially stacked from the charge generation layer 300 to the second electrode 120.

In the present embodiment, a driving voltage of the first emitting layer 210 at the luminance of 1000 cd/m$^2$ is lower than a driving voltage of the second emitting layer 410e at the luminance of 1000 cd/m$^2$ by at least 0.5 V. In other words, a start-up driving voltage of the second emitting layer 410e is greater than the start-up driving voltage of the first emitting layer 210. Therefore, when the voltage or current applied to the OLED illumination module 100e gradually increases, the first emitting layer 210 lights up first, and the second emitting layer 410e then lights up to lower the CCT of the light emitted by the OLED illumination module 100e. Moreover, in the present embodiment, the OLED layer stack 400e with higher start-up driving voltage may be obtained by selecting the hole transport layer or the electron transport layer with lower carrier mobility. In addition, in the present embodiment, when the first emitting layer 210 emits light while the second emitting layer 410e does not emit light, the color rendering index Ra is greater than 60. When both the first emitting layer 210 and the second emitting layer 410e emit light, the color rendering index Ra is greater than 75. Accordingly, the second emitting layer 410e can effectively increase the color rendering index.

Figure 10:
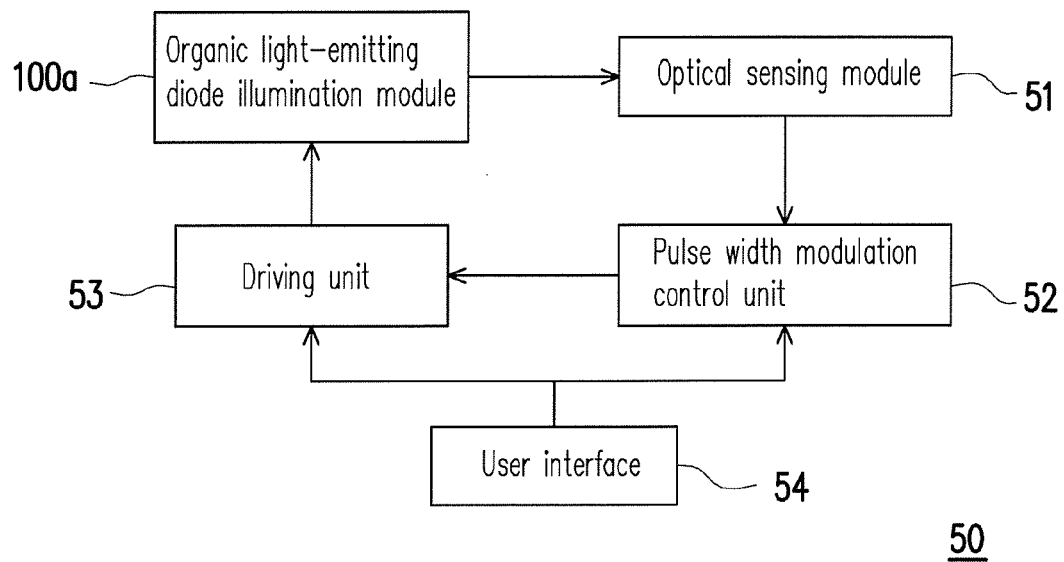
FIG. 10 is a block diagram of an OLED apparatus according to an embodiment of the disclosure.
Figure 11:
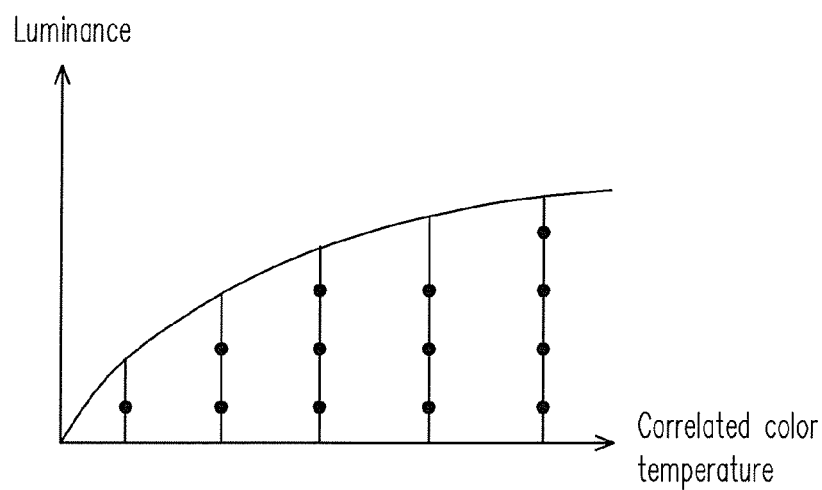
FIG. 11 illustrates a modulation range of luminance of the OLED illumination module in FIG. 10 by pulse width modulation (PWM) in relative to CCTs.

FIG. 10 is a block diagram of an OLED apparatus according to an embodiment of the disclosure, and FIG. 11 illustrates a modulation range of luminance of the OLED illumination module in FIG. 10 by pulse width modulation (PWM) in relative to CCT. Referring to FIG. 10 and FIG. 11, an OLED apparatus 50 of the present embodiment includes any one of the OLED illumination modules 100 and 100a to 100e in the previous embodiments (in FIG. 10, the OLED illumination module 100a is exemplarily adopted), an optical sensing module 51, a PWM control unit 52 and a driving unit 53. The driving unit 53 is electrically connected to the OLED illumination module 100a, and adjusts the voltage applied to the OLED illumination module 100a so as to change the CCT of light emitted by the OLED apparatus 50. The optical sensing module 51 is configured to sense the light emitted by the OLED illumination module 100a. The PWM control unit 52 is configured to receive a feedback signal from the optical sensing module 51, so as to adjust the light intensity of the OLED illumination module 100a by means of PWM.

In the present embodiment, the OLED illumination module 100a may adjust the CCT of light emitted therefrom by adjusting the direct current (DC) operation voltage applying to the OLED illumination module 100a. In addition, the optical sensing module 51 transmits an electrical signal of the light intensity (e.g., luminance) of the corresponding OLED illumination module 100a to the pulse width modulation (PWM) control unit 52. The PWM control unit 52 receives the electrical signal from the optical sensing module 51. A PWM algorithm then appropriately set according to a variation relationship between the CCT and the luminance at various DC operation voltages of the OLED illumination module 100a, so as to adjust a duty cycle of the PWM, namely, a pulse width of the voltage applied to the OLED illumination module 100a. As a result, the CCT of the OLED illumination module 100a can be adjusted, and the luminance at various CCTs of the OLED illumination module 100a can be appropriately and stably outputted.

In the PWM of some embodiments, the top point of the voltage pulse applied to the OLED illumination module 100a is the DC voltage operation point of the OLED illumination module, which may be adjusted, and the bottom point of the voltage pulse may be 0 V. However, in some other embodiments, the bottom point of the voltage pulse may also be adjusted. For example, the bottom point of the voltage pulse may be adjusted to a voltage greater than 0 V, so that the OLED illumination module 100a may be switched between two DC voltage operation points back and forth. As a result, by adjusting the duty cycle of the PWM, the CCT and the luminance of the OLED illumination module can be gradually varied periodically or non-periodically.

The OLED apparatus 50 of the present embodiment may further include a user interface 54. According to the variation relationship between the CCT and the luminance at various DC operation voltages of the OLED illumination module 100a, the DC operation voltage of the OLED illumination module 100a may be adjusted by a user through the user interface 54, so as to adjust the CCT of the OLED illumination module 100a. The user interface 54 may include a knob, a button, a touch panel, a touch display, a mouse, a keyboard, a microphone with an analog-to-digital (A/D) converter, or any combination thereof. When the voltage applied to the OLED illumination module 100a is changed, the CCT of the OLED illumination module 100a also changes. Therefore, the optical sensing module 51 can detect the light intensity (e.g. luminance) and the CCT of the OLED illumination module 100a, and the PWM control unit 52 can adjust the luminance of the OLED illumination module 100a by adjusting the duty cycle of the PWM.

Referring to FIG. 11, when the duty cycle of the PWM is 100%, it means that the DC operation voltage applied to the OLED illumination module 100a is kept at a constant voltage, and the luminance and the corresponding CCT of the OLED illumination module 100a are at the point on the curve shown in FIG. 11. When the DC operation voltage having the duty cycle of 100% is increased, both the CCT and the luminance are increased. When the duty cycle is adjusted to be less than 100%, the CCT and the corresponding luminance are at the point under the curve shown in FIG. 11. In this case, when the top point voltage of the pulse voltage is kept and when the duty cycle is varied, the CCT remains unchanged, so that the point representing the CCT and the luminance moves along a vertical line under the curve and corresponding to the CCT. In addition, the less the duty cycle, the lower the point on the vertical line, and the lower the luminance of the OLED illumination module.

In one embodiment, an additional OLED layer stack can be connected to the OLED illumination module in series, for example, in a tandem form, and the additional OLED layer stack can supplement some luminance for the low luminance at the low CCT in FIG. 11. That is, when the additional OLED layer stack is operated in a low DC voltage, the additional OLED layer stack can increase the luminance.

Moreover, when the bottom point of the voltage pulse is adjusted to a voltage greater than 0 V, the OLED illumination module 100a may be switched between two DC voltage operation points back and forth, so that the CCT of the OLED illumination module 100a may be switched between two values back and forth. As a result, by adjusting the duty cycle of the PWM, the CCT and the luminance of the OLED illumination module may be gradually varied periodically or non-periodically.

Figure 12:
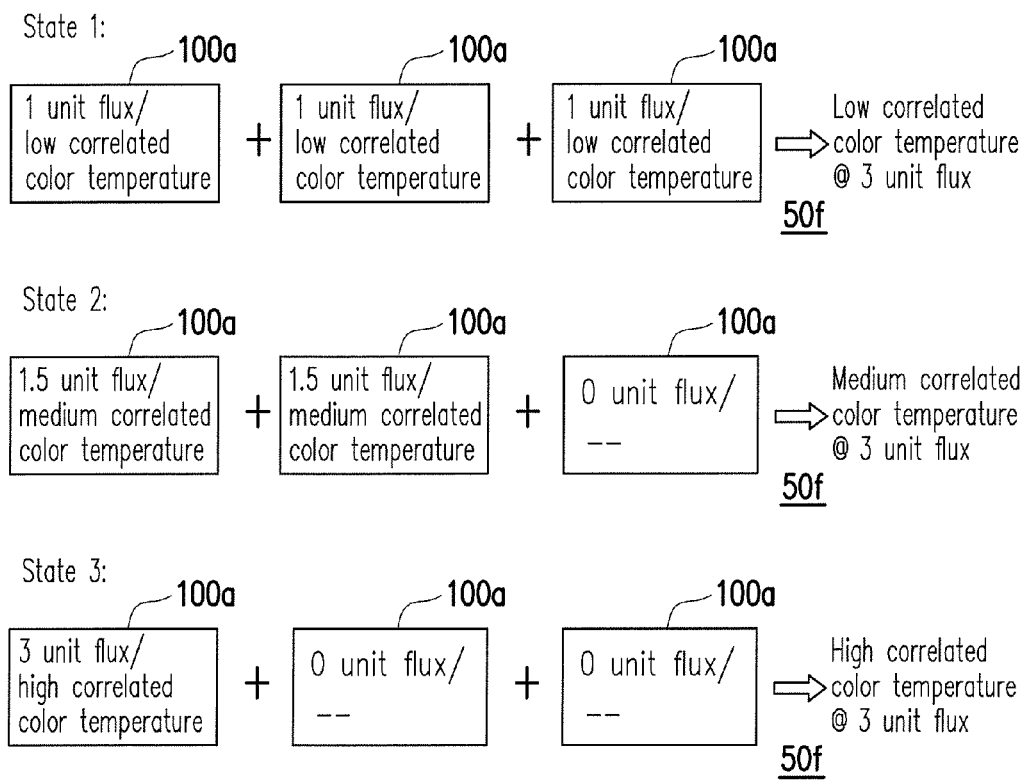
FIG. 12 illustrates three different operating states of the OLED apparatus according to another embodiment of the disclosure.

FIG. 12 illustrates three different operating states of the OLED apparatus according to another embodiment of the disclosure. Referring to FIG. 12, an OLED apparatus 50f of the present embodiment can include a plurality of OLED illumination modules 100 and 100a to 100e in the previous embodiments, and a plurality of OLED illumination modules 100a are shown in FIG. 12. The plurality of OLED illumination modules 100a of the present embodiment can be electrically connected with the driving unit 53 of FIG. 10. Moreover, in one embodiment, the OLED apparatus 50f may further include the optical sensing module 51, the PWM control unit 52 and the user interface 54 as shown in FIG. 10; that is, the single OLED illumination module 100a in the OLED apparatus 50 of FIG. 10 can be replaced by the plurality of OLED illumination modules 100a of the present embodiment, so as to form the OLED apparatus 50f having the plurality of OLED illumination modules 100a, but the disclosure is not limited thereto.

In FIG. 12, three OLED illumination modules 100a are exemplarily shown in the OLED apparatus 50f, but the disclosure is not limited thereto. As shown in FIG. 11 and as described in the aforementioned paragraphs, when the CCT of the OLED illumination module 100a is low, the DC operation voltage applied to the OLED illumination module 100a is low, and the luminance of the OLED illumination module 100a is low. If it is required to maintain similar luminance at various CCTs, a plurality of the OLED illumination modules 100a may be adopted in the OLED apparatus 50f.

As shown in FIG. 12, when light with low CCT is required, all the OLED illumination modules 100a (e.g., three OLED illumination modules 100a in FIG. 12) are lighted up (i.e., state 1), and a luminous flux of the light emitted by each of the OLED illumination modules 100a is 1 unit flux, so that the total luminous flux of the light emitted by the OLED apparatus 50f is 3 unit flux. When light with medium CCT is required, parts of the OLED illumination modules 100a (e.g., two OLED illumination modules 100a in FIG. 12) are lighted up, whereby a luminous flux of the light emitted by each of the two OLED illumination modules is 1.5 unit flux, while the remaining OLED illumination module 100a is turned off, and thus the total luminous flux of light emitted by the OLED apparatus 50f is 3 unit flux. When light with high CCT is required, less part of the OLED illumination modules 100a (e.g., one OLED illumination module 100a in FIG. 12) is lighted up, whereby a luminous flux of the light emitted by the one OLED illumination module 100a is 3 unit flux, while the remaining OLED illumination modules 100a are turned off, and thus the total luminous flux of light emitted from the OLED apparatus 50f is 3 unit flux. In this way, the OLED apparatus 50f can maintain similar luminance at various CCTs.

Figure 13A:
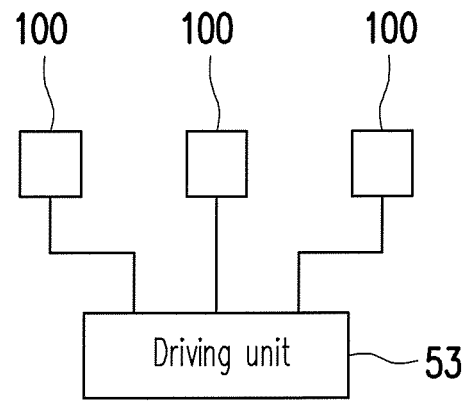
FIG. 13A through FIG. 13D are four variants of the OLED apparatus according to another embodiment of the disclosure.

The OLED apparatus 50f including the plurality of OLED illumination modules 100a may have the following variations:

Variant (1): as shown in FIG. 13A, an OLED apparatus 50g includes a plurality of independent OLED illumination modules 100, which are incapable of adjusting the CCT but have a plurality of CCTs, respectively, especially by having emitting sub-layers with different thicknesses or different dopant concentrations in the white emitting layer. In addition, the driving unit 53 is electrically connected to the OLED illumination modules 100 and determines the proportions of the light intensity of the OLED illumination modules 100, respectively, so as to achieve the modulation of the CCT of the overall OLED apparatus 50g.

Figure 13B:
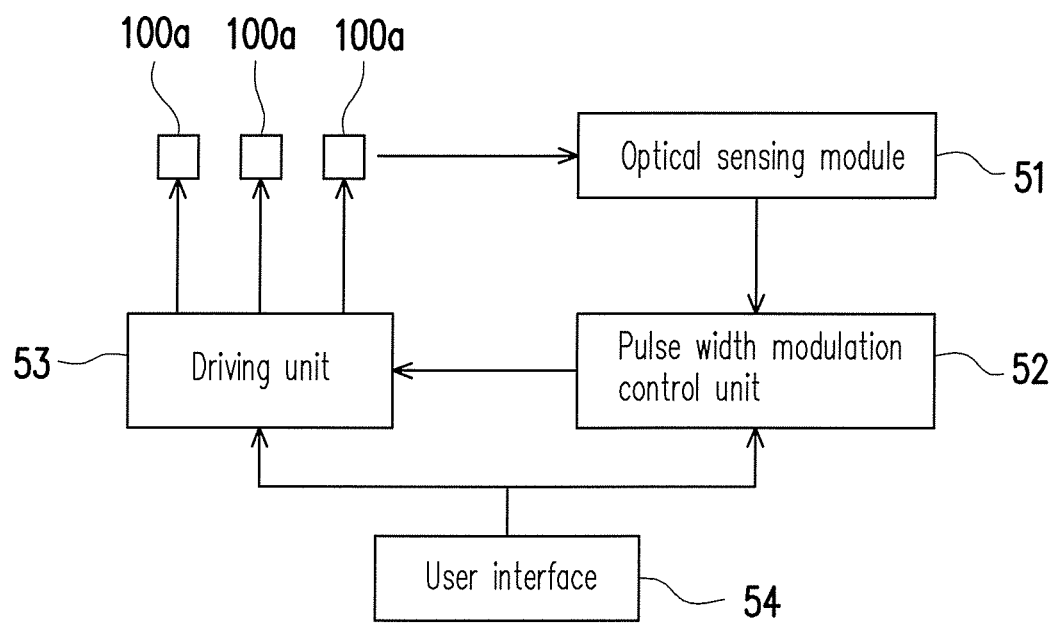

Variant (2): as shown in FIG. 13B, an OLED apparatus 50h includes a plurality of independent OLED illumination modules 100a (which can also be the OLED illumination modules 100 or 100b to 100e, wherein the OLED illumination modules 100a are exemplarily adopted herein), which are capable of being respectively switched to a plurality of CCTs by applying different operation voltages. In addition, the driving circuit is electrically connected to the OLED illumination modules 100a, so as to control the CCT variations and the luminance variations of the OLED illumination modules 100a. In the present embodiment, the OLED illumination modules 100a can substantially be identical.

In the present embodiment, the OLED apparatus 50h may further include an optical sensing module 51, a PWM control unit 52 and a user interface 54, wherein the operation methods thereof are as described in the embodiment of FIG. 10. Moreover, in the present embodiment, the driving unit 53 adjusts the voltages applied to the OLED illumination modules 100a, respectively, so as to change the CCT of the light emitted by the OLED apparatus 50h. In addition, the optical sensing module 51 is configured to sense the lights emitted by the OLED illumination modules 100a. The PWM control unit 52 is configured to receive a feedback signal from the optical sensing module 51, so as to adjust the light intensities of the OLED illumination modules 100a. A total light intensity of the overall OLED apparatus 50h can be adjusted by applying various voltages and various duty cycles to the OLED illumination modules 100a, respectively.

The OLED apparatus 50g (FIG. 13A) of variant (1) may also include the optical sensing module 51, the PWM control unit 52 and the user interface 54 as shown in FIG. 13B, and the OLED apparatus 50h of variant (2) in FIG. 13B may also include the driving unit 53 as shown in FIG. 13A instead of the optical sensing module 51. In addition, variant (3) and variant (4) below may also include the driving unit 53 as shown in FIG. 13A, or the optical sensing module 51, the PWM control unit 52 and the user interface 54 as shown in FIG. 13B.

Figure 13C:
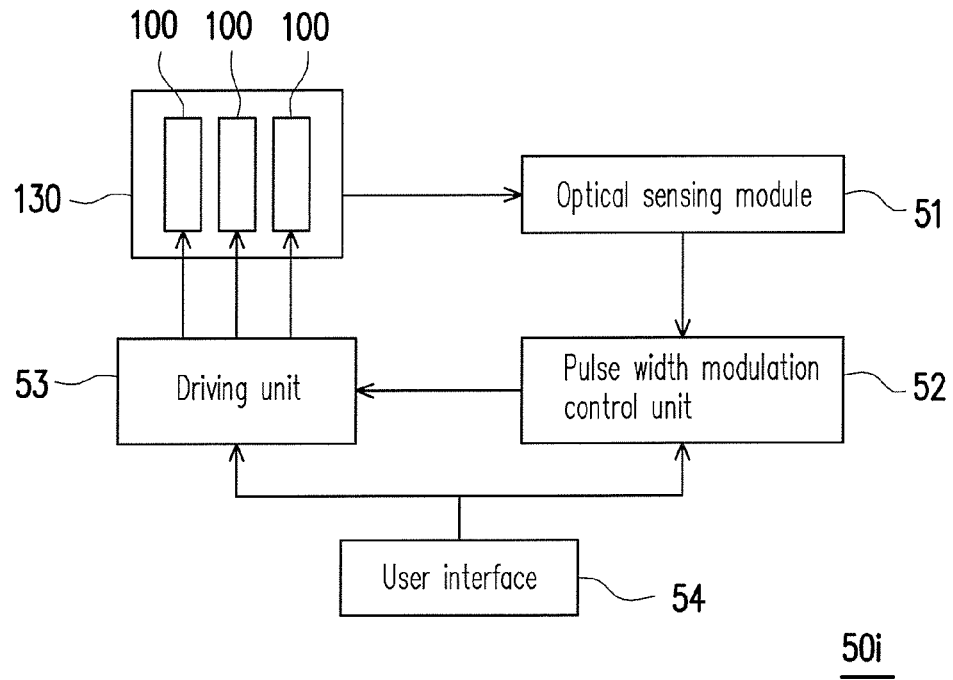

Variant (3): as shown in FIG. 13C, a plurality of OLED illumination modules 100 in an OLED apparatus 50i are connected together physically. In other words, the stacked layers of the OLED illumination modules 100 are disposed on a same substrate 130; that is, the OLED illumination modules 100 can be regarded as a plurality of OLED illumination sub-modules combining into a single module. For instance, a plurality of OLED units (i.e., the OLED illumination modules 100) on the same substrate 130 is incapable of adjusting the CCT, but has a plurality of CCTs, respectively, by having emitting sub-layers with different thicknesses or different dopant concentrations in the white emitting layer. In addition, the driving circuit 53 is electrically connected to the OLED units and determines the proportions of the light intensity of the OLED illumination modules 100, respectively, so as to achieve the modulation of the CCT of the overall OLED apparatus 50i. In the present embodiment, the OLED units are, for example, strip-shaped.

Figure 13D:
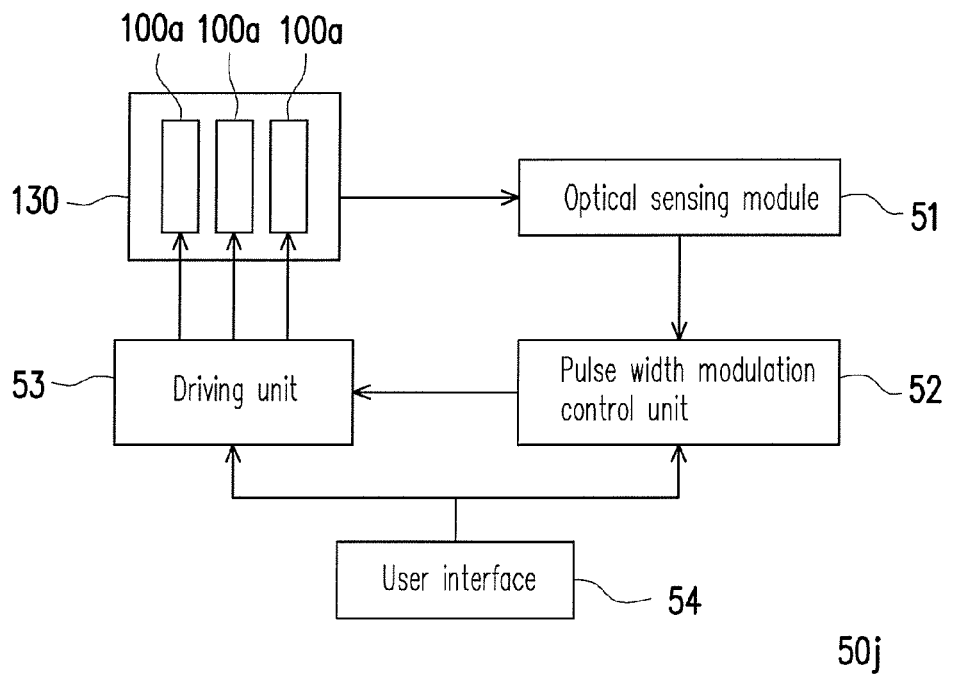

Variant (4): as shown in FIG. 13D, a plurality of OLED illumination modules 100a in an OLED apparatus 50j are connected together physically. In other words, the stacked layers of the OLED illumination modules 100a are disposed on a same substrate 130; that is, the OLED illumination modules 100a can be regarded as a plurality of OLED illumination sub-modules combining into a single module. For instance, a plurality of OLED units (i.e., OLED illumination modules 100a) on the same substrate 130 is substantially the same. In addition, the OLED units are capable of adjusting the CCT, and are capable of being respectively switched to a plurality of CCTs by applying different operation voltages. Furthermore, the driving circuit 53 is electrically connected to the OLED illumination modules 100a so as to controls the CCT variations and the luminance variations of the OLED illumination modules 100a. In the present embodiment, the OLED units are, for example, strip-shaped.

Figure 14A:
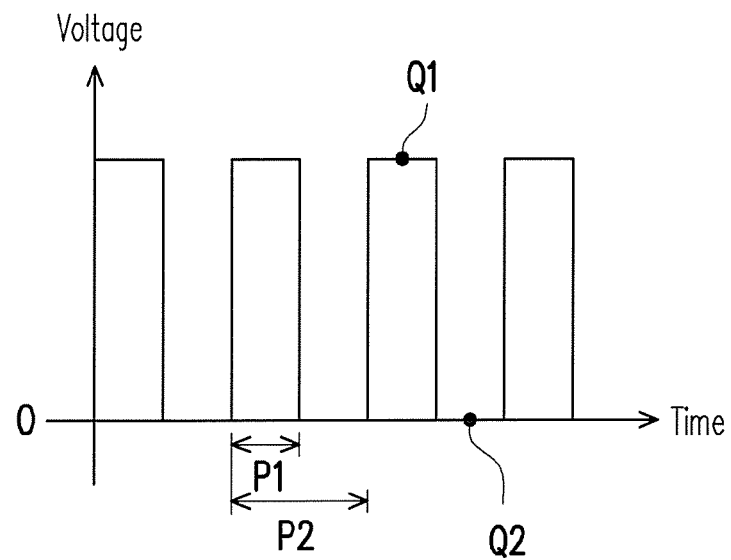
FIG. 14A and FIG. 14B are waveform diagrams of two PWM signals.
Figure 14B:
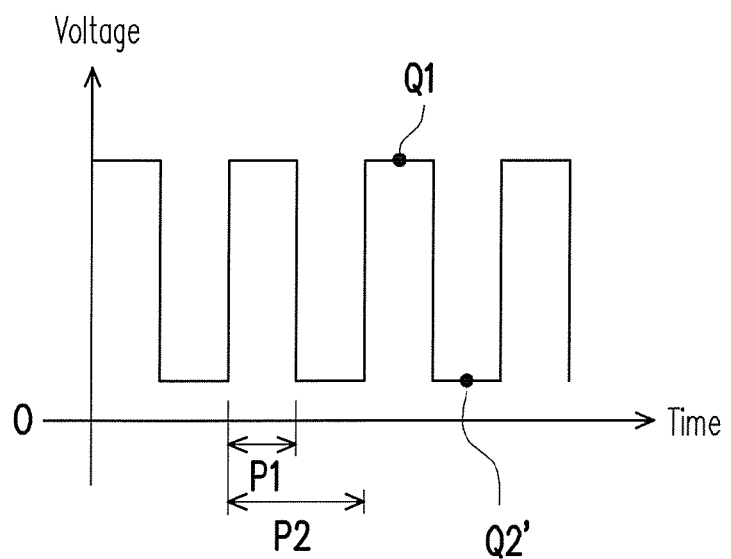

FIG. 14A and FIG. 14B are waveform diagrams of two aforementioned PWM signals. Referring to FIG. 14A, a duty cycle of the aforementioned PWM signal is defined by a definition well known to those skilled in the art, that is, time slot P1 divided by time slot P2 in FIG. 14A, and a top point Q1 and a bottom point Q2 of the voltage pulse are as shown in FIG. 14A. In the example shown in FIG. 14A, the bottom point Q2 of the voltage pulse is at 0 V. In addition, referring to FIG. 14B, a duty cycle of the aforementioned PWM signal is defined by a definition well known to those skilled in the art, that is, time slot P1 divided by time slot P2 in FIG. 14B, and a top point Q1 and a bottom point Q2' of the voltage pulse are as shown in FIG. 14B. In the example shown in FIG. 14B, the bottom point Q2' of the voltage pulse is at 0 V.

In the present disclosure, the substrate (e.g., substrate 130) is, for example, a soda lime glass substrate, a willow glass, a flexible thin-glass, a high-refractive index glass (the refractive index thereof is greater than 1.7), polyester (PET), polyethylene naphthalate (PEN), polyimide (PI), or the above substrate with light out-coupling structures. The material of the first electrode 110 may be indium tin oxide (ITO), doped zinc oxide (e.g., indium zinc oxide (IZO), aluminum zinc oxide (AZO) or gallium zinc oxide (GZO)), graphene, carbon nanotube (CNT), poly(3,4-ethylenedioxy-thiophene):poly(styrenesulfonate), PEDOT:PSS) or any combination thereof. The material of the second electrode 120 may be aluminum, silver or a combination thereof. The material of the hole injection layer may include PEDOT:PSS, 1,4,5,8,9,11-Hexaazatriphenylenehexacarbonitrile, HATCN, or transparent metal oxide such as $MoO_3$, $V_2O_5$, or $WO_3$. The material of the hole transport layer may include N,N'-bis(naphthalen-1-yl)-N,N'-bis(phenyl)-2,2'-dimethyl-benzidine (α-NPD), N,N'-bis(naphthalen-1-yl)-N,N'-bis(phenyl)-benzidine (NPB), Di-[4-(N,N-ditolyl-amino)-phenyl]cyclohexane (TAPC), (2,3,5,6-Tetrafluoro-2,5-cyclohexadiene-1,4-diylidene)dimalononitrile7,7,8,8-Tetracyano-2,3,5,6-tetrafluoroquinodimethane (F4-TCNQ), N,N,N',N'-tetrakis(4-methoxyphenyl)benzidine (MEO-TPD), or bi-layer arrangement with any combination thereof. The material of the emitting layer may include a phosphorescent light emitting host material such as 4,4',4''-tris(carbazol-9-yl)triphenylamine (TCTA), 2,2',2''-(1,3,5-benzinetriyl)-tris(1-phenyl-1-H-benzimidazole (TBPi), 1,3-Bis(N-carbazolyl)benzene (mCP), 4,4'-bis(carbazol-9-yl) biphenyl (CBP), 1,3-bis(triphenylsilyl)benzene (UGH), 9,9'-(5-(triphenylsilyl)-1,3-phenylene)bis(9H-carbazole) (SimCP), 2,6-bis(3-(9H-carbazol-9-yl)phenyl)pyridine (26DCzPPy) or 9,9-spirobifluoren-2-yl-diphenyl-phosphine oxide (SPPO1), which is doped with phosphorescent emitter dopant such as Firpic, FIr6, Ir(ppy)3, Ir(ppy2)acac, Ir(pq)2acac, or Ir(MDQ)2acac. The material of the emitting layer may include blue fluorescent light emitting materials such as 4,4'-Bis(2,2-diphenyl-ethen-1-yl)biphenyl (DPVBi), 4,4'-bis(9-ethyl-3-carbazovinylene)-1,1'-biphenyl (BCzVBi), N,N'-di-(1-naphthalenyl)-N,N-diphenyl-[1,1':4',1'':4''',1''''-quaterphenyl]-4,4'''-diamine (4PNPB), p-bis p-N,N-diphenylaminostyryl benzene (DSA-Ph), N,N'-(((1E,1'E)-1,4-phenylenebis(ethene-2,1-diyl))bis(4,1-phenylene))bis(2-ethyl-6-methyl-N-phenylaniline) (BUBD-1), or 2-methyl-9,10-di 2-naphthyl anthracene (MADN). The material of the electron transport layer may include Tris-(8-hydroxyquinoline)aluminum (Alq3), 4,7-Diphenyl-1,10-phenanthroline (Bphen), 2,9-dimethyl-4,7 diphenyl-1,10-phenanthroline (BCP), TBPi, 3-(Biphenyl-4-yl)-5-(4-tert-butylphenyl)-4-phenyl-4H-1,2,4-triazole (TAZ), 1,3,5-Tri(m-pyrid-3-yl-phenyl)benzene (TmPyPB), bis-1,2-(3,5-di-3-pyridyl-phenyl)benzene (B3PyPB) or any combination thereof. The electron transport layer may be doped with Cs, $CsCO_3$, Li or Liq. The material of the electron injection layer may include LiF, aluminum, Liq, Mg, Ca or any combination thereof.

Figure 15:
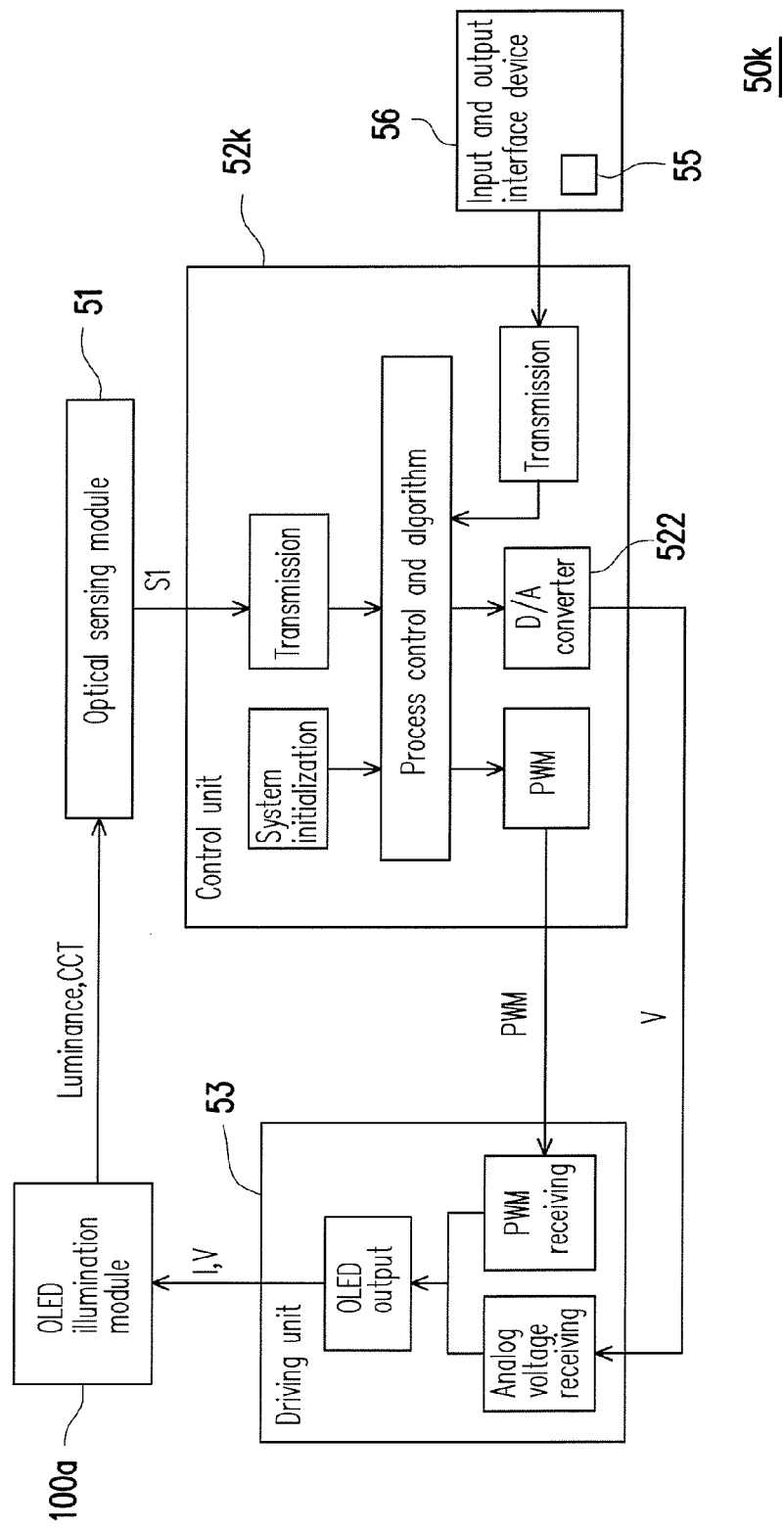
FIG. 15 is a schematic diagram of an OLED apparatus according to another embodiment of the disclosure.

FIG. 15 is a schematic diagram of an OLED apparatus according to another embodiment of the disclosure. Referring to FIG. 15, the organic light-emitting diode (OLED) apparatus 50k in this embodiment includes at least one OLED illumination module (an OLED illumination module 100a is exemplarily shown in FIG. 15), a driving unit 53, an optical sensing module 51, a control unit 52k, and a storage unit 55. The driving unit 53 is electrically connected to the OLED illumination module 100a and configured to adjust voltage applied to the OLED illumination module 100a, so as to change a correlated color temperature (CCT) of light emitted by the OLED illumination module 100a. The optical sensing module 51 is configured to sense a light emitted by the OLED illumination module 100a. In this embodiment, the optical sensing module 51 is configured to sense the light intensity and the CCT of the light emitted by the OLED illumination module 100a.

The control unit 52k is configured to receive a feedback signal S1 from the optical sensing module 51 so as to adjust a light intensity and the CCT of the OLED illumination module 100a. The light intensity and the CCT of the OLED illumination module 100a is adjusted by adjusting the voltage and a duty cycle of a pulse wavelength modulation (PWM) to the OLED illumination module 100a. The storage unit 55 is configured to store photoelectric parameter data of the OLED illumination module 100a. The control unit 52k is configured to adjust the CCT and the light intensity of the OLED illumination module 100a to target values according to the photoelectric parameter data.

In this embodiment, the OLED apparatus 50k further includes an input and output interface device 56 electrically connected or wirelessly connected to the control unit 52k. The storage unit 55 may be integrated in the input and output interface device 56, and the input and output interface device 56 includes a computer, a portable computing device, e.g. a smartphone, a tablet computer, a personal digital assistant (PDA), or a remote controller, or an embedded system. However, in some other embodiments, the storage unit 55 may be integrated in the control unit 52k. In this embodiment, the signal transmission between the input and output interface device 56 and the control unit 52k and between the optical sensing module 51 and the control unit 52k may be serial transmission or parallel transmission.

In this embodiment, the photoelectric parameter data includes the relationship between at least two of the voltage applied to the OLED illumination module 100a, the CCT of the OLED illumination module 100a, the current applied to the OLED illumination module 100a, and the light intensity of the OLED illumination module 100a.

In this embodiment, the photoelectric parameter data includes the relationship at two end points of the voltage applied to the OLED illumination module 100a. Moreover, the control unit 52k may be configured to calculate target values by interpolation based on the relationship.

Specifically, when the OLED apparatus 50k is started up, the photoelectric parameter data including the relationship at two end points of the voltage applied to the OLED illumination module are obtained. For example, at one of the two end points, the voltage applied to the OLED illumination module 100a is 3.0 V, the current applied to the OLED illumination module 100a is $2.25 \times 10^{-1}$ mA, the luminance of the OLED illumination module 100a detected by the optical sensing module 51 is 93 $cd/m^2$, and the CCT of the OLED illumination module 100a detected by the optical sensing module 51 is 2653 K. At the other of the two end points, the voltage applied to the OLED illumination module 100a is 8.0 V, the current applied to the OLED illumination module 100a is $6.62 \times 10^{+1}$ mA, the luminance of the OLED illumination module 100a detected by the optical sensing module 51 is 302 $cd/m^2$, and the CCT of the OLED illumination module 100a detected by the optical sensing module 51 is 3056 K.

Figure 16:
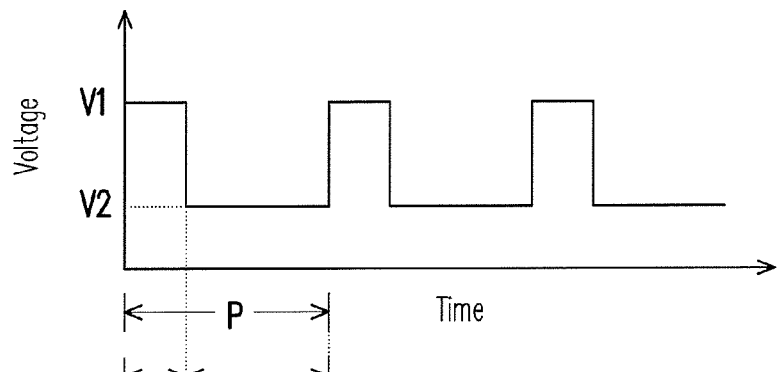
FIG. 16 is a wave form diagram of the voltage applied to the OLED illumination module in the OLED apparatus shown in FIG. 15.

FIG. 16 is a wave form diagram of the voltage applied to the OLED illumination module in the OLED apparatus shown in FIG. 15. Referring to FIGS. 15 and 16, the voltage applied to the OLED illumination module 100a may be alternately voltage V1 and voltage V2. In this embodiment, voltage V1 is, for example, 8.0V, and voltage V2 is, for example, 3.0 V. The control unit 52k may adjust the percentages of voltage V1 and voltage V2 in a period P.

The following Table 1 shows the percentages of voltage V1 and voltage V2 and their corresponding CCT and luminance.

TABLE 1

| PWM | Percentage of voltage V1 (3056K) | Percentage of voltage V2 (2653K) | Measured CCT (K) | Luminance (cd/m²) | Predicted CCT (K) |
|---|---|---|---|---|---|
| 100% | 0 | 100 | 2653 | 93 | |
| 100% | 25 | 75 | | 146 | 2862.3 |
| 100% | 50 | 50 | | 200 | 2961.0 |
| 100% | 75 | 25 | | 251 | 3018.4 |
| 100% | 100 | 0 | 3056 | 302 | |

Referring to Table 1 and FIG. 16, the percentage of voltage V1 is (T1/P)×100%, where T1 is the time slot T1 of the voltage V1 shown in FIG. 16, and P is the period P shown in FIG. 16. Moreover, the percentage of voltage V2 is (T2/P)×100%, where T2 is the time slot T2 of the voltage V2 shown in FIG. 16, and P is the period P shown in FIG. 16. When the percentage of voltage V1 is 0% and the percentage of voltage V2 is 100%, the measured CCT is 2653 K, and the measured luminance is 93 cd/m², which is the case of one of the two end points. When the percentage of voltage V1 is 100% and the percentage of voltage V2 is 0%, the measured CCT is 3056 K, and the measured luminance is 302 cd/m², which is the case of the other one of the two end points. The control unit 52k may calculate the predicted CCT and luminance at various percentages of voltages V1 and V2 by interpolation.

Figure 17A:
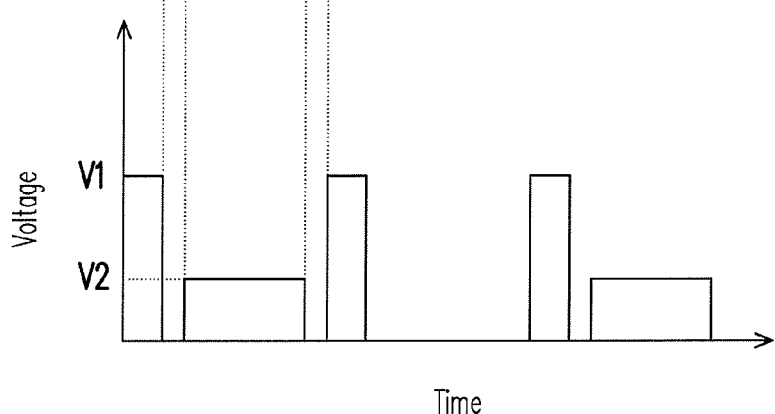
FIG. 17A is a wave form diagram of the voltage applied to the OLED illumination module in the OLED apparatus shown in FIG. 15 when the PWM is performed.
Figure 17B:
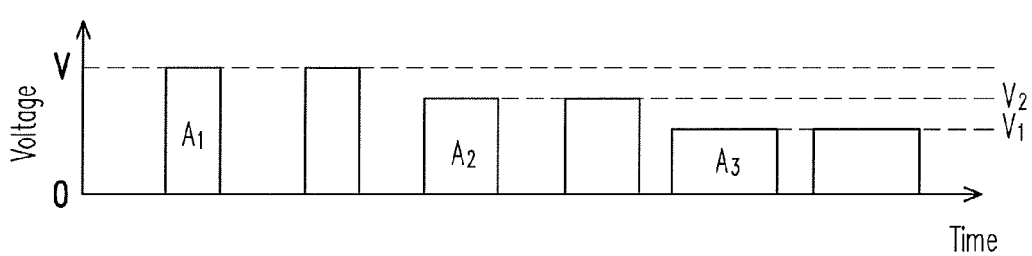
FIG. 17B shows the CCT of the OLED illumination module in FIG. 15 may be adjusted at fixed luminous.

If a CCT of 3018 K is needed, the control unit 52k calculates the corresponding percentages of voltages V1 and V2 are 75% and 25%, respectively. However, the corresponding luminance is 251 cd/m², which may be not satisfy the requirement. For example, if the target CCT and luminance are 3018 K and 200 cd/m², respectively, the control unit 52 may calculate the corresponding duty cycle of PWM is 80%, so that the control unit 52 controls the driving unit 53 to supply voltage to the OLED illumination module 100a as shown in FIG. 17A. In FIG. 17A, the duty cycle of the voltage V1 is (D1/T1)×100% shown in FIG. 17A and is 80%, and the duty cycle of the voltage V2 is (D2/T2)×100% shown in FIG. 17A and is 80%. As a result, the CCT and the light intensity (e.g. luminance) may be adjusted to the target values (i.e. 3018 K and 200 cd/m²) according the photoelectric parameter data (i.e. the data at the two end points). In another embodiment as shown in FIG. 17B, the CCT may be adjusted at fixed luminous, and the area $A_1$ of pulse V is substantially equal to the area $A_2$ of pulse $V_2$ and is substantially equal to the area $A_3$ of pulse $V_1$, wherein the area of the pulse means the area surrounded by the pulse and the horizontal axis (i.e. the time axis).

In another embodiment, the photoelectric parameter data includes the relationship in a table form having three or more voltages applied to the OLED illumination module. In this embodiment, the voltages applied to the OLED are not limited to the aforementioned voltage V1 and voltage V2 but may be varied. When the OLED apparatus 50k is started up, the photoelectric parameter data including the relationship in a table form having three or more voltages applied to the OLED illumination module are obtained, and the following Table 2 shows an example of this table.

TABLE 2

| Voltage (V) | Current (mA) | Luminance (cd/m2) | CCT (K) |
|---|---|---|---|
| 2.0 | 2.85E−05 | 0 | 0 |
| 3.0 | 2.25E−01 | 57 | 2011 |
| 4.0 | 1.89E+00 | 428 | 2569 |
| 5.0 | 7.06E+00 | 1363 | 2933 |
| 6.0 | 1.67E+01 | 2956 | 3196 |
| 7.0 | 3.36E+01 | 5820 | 3430 |
| 8.0 | 6.62E+01 | 11790 | 3634 |

Figure 18A:
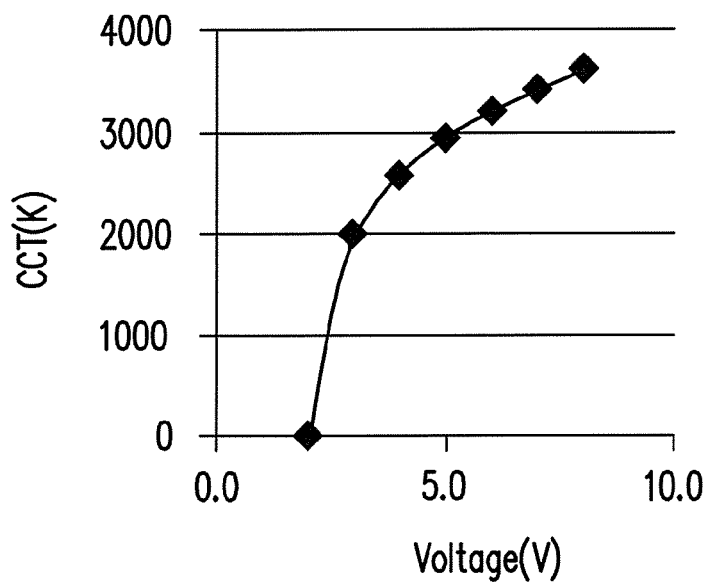
FIG. 18A shows the CCT-voltage curve of the OLED illumination module in FIG. 15.
Figure 18B:
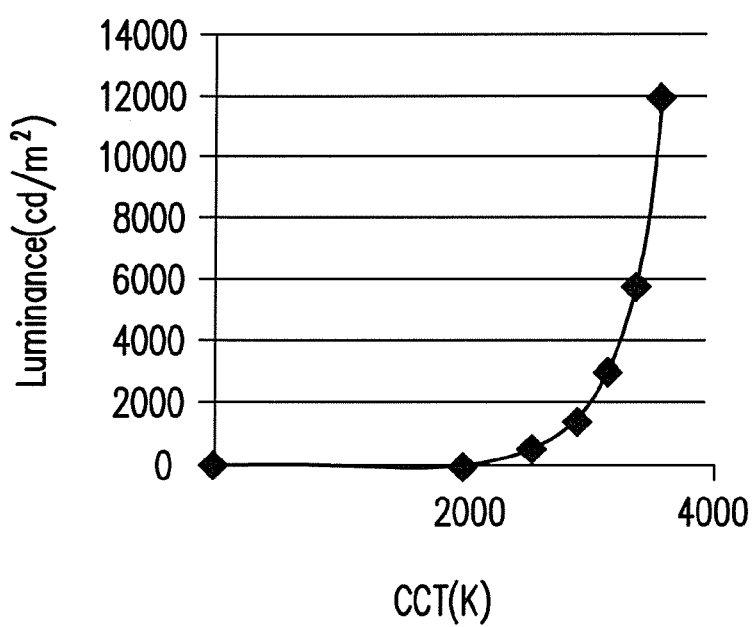
FIG. 18B shows the luminance-CCT curve of the OLED illumination module in FIG. 15.

In Table 2, "2.85E-05" means "2.85×10⁻⁵", and the others may be deduced therefrom by analogy. In this embodiment, when the OLED apparatus 50k is started up, the control unit 52k control the driving unit 53 to apply a plurality of voltages (e.g. 2.0 V to 8.0 V as shown in Table 2) to the OLED illumination module 100a in turn, and the optical sensing module 51 detects the luminance and CCT of the OLED illumination module 100a when the OLED illumination module 100a is applied with these voltages, respectively, so at to obtain the data in Table 2. From Table 2, the CCT-voltage curve shown in FIG. 18A and the luminance-CCT curve shown in FIG. 18B may be obtained.

Then, when target values are input to the control unit 52k, e.g. CCT of 3000 K and luminance of 1000 cd/m², the control unit 52k adjusts the voltage applied to the OLED illumination module 100a from 5V to 6V, so as to adjust the voltage to a value corresponding to the CCT of 3000 K. When the control unit 52k adjusts the voltage, the optical sensing module 51 may detect the OLED illumination module 100a and transmit the feedback signal to the control unit 52k. In another embodiment, the voltage value corresponding to the CCT of 3000 K may be calculated through the control unit 52k by interpolation. After that, the duty cycle of the voltage corresponding to the CCT of 3000 K may be adjusted so that the luminance of the OLED illumination module 100a may be adjusted to the target value of 1000 cd/m². When the duty cycle of the voltage is adjusted, the optical sensing module 51 may transmit the feedback signal to the control unit 52k, so that the control unit 52k may determine whether the luminance of the OLED illumination module 100a reaches the target value.

In another embodiment, when the obtained table when the OLED apparatus 50k is started up has voltage values which are many enough, the control unit 52k may directly adjust the voltage applied to the OLED illumination to the target value according to the table.

Referring to FIG. 15, the control unit 52k may be programmable, may receive signals from the optical sensing module 51 and process the received signals, may transmit signals to the input and output interface device 56, may transmit an analog voltage signal to the driving unit 53 through the digital-to-analog converter 522, and may transmit a PWM signal to the driving unit 53 so as to adjust the light intensity of the OLED illumination module 100a.

The driving unit 53 may receive the PWM signal from the control unit 52k and converts the PWM signal into the adjustment of the duty cycle of the voltage applied to the OLED illumination module 100a, may receive the analog voltage signal from the control unit 52k, and may adjust the voltage and the signal to control the CCT and light intensity of the OLED illumination module 100a. The input and output interface device 56 may have operation interface, may store the data of the voltage, current, and detected information of the OLED illumination module 100a, may have a display interface for displaying the received and output signals.

In this embodiment, the control unit 52k may input a digital-to-analog converted analog signal in a limited range to the driving unit 53, so as to adjust the CCT of the OLED illumination module 100a. Then, the optical sensing module 51 may detect the light intensity and CCT of the OLED illumination module 100a, and feed back the light intensity and CCT to the control unit 52k. The input and output interface device 56 or the control unit 52k records the variation curve table of the voltage, current, light intensity, and CCT by the storage unit 55 when the analog voltage received by the driving unit 53 is in a safe range. The aforementioned obtaining the photoelectric parameter data may be performed when the control unit 52k is initialized or when the photoelectric parameter data is needed to be obtained again according to the requirements. When the photoelectric parameter data is obtained, the adjustable range may be defined by the calculated curve table, and a target CCT and light intensity may be input by the user. After that, the control unit 52k control the CCT by the analog voltage, and output the PWM signal to the driving unit 53 so as to control the light intensity. In addition, the optical sensing module 51 feeds back the light intensity and CCT to the control unit so as to modify the light intensity and CCT. As a result, the OLED apparatus 50k having the function of automatic detection and capable of automatically tracking the target value and changing the CCT is achieved.

Figure 19:
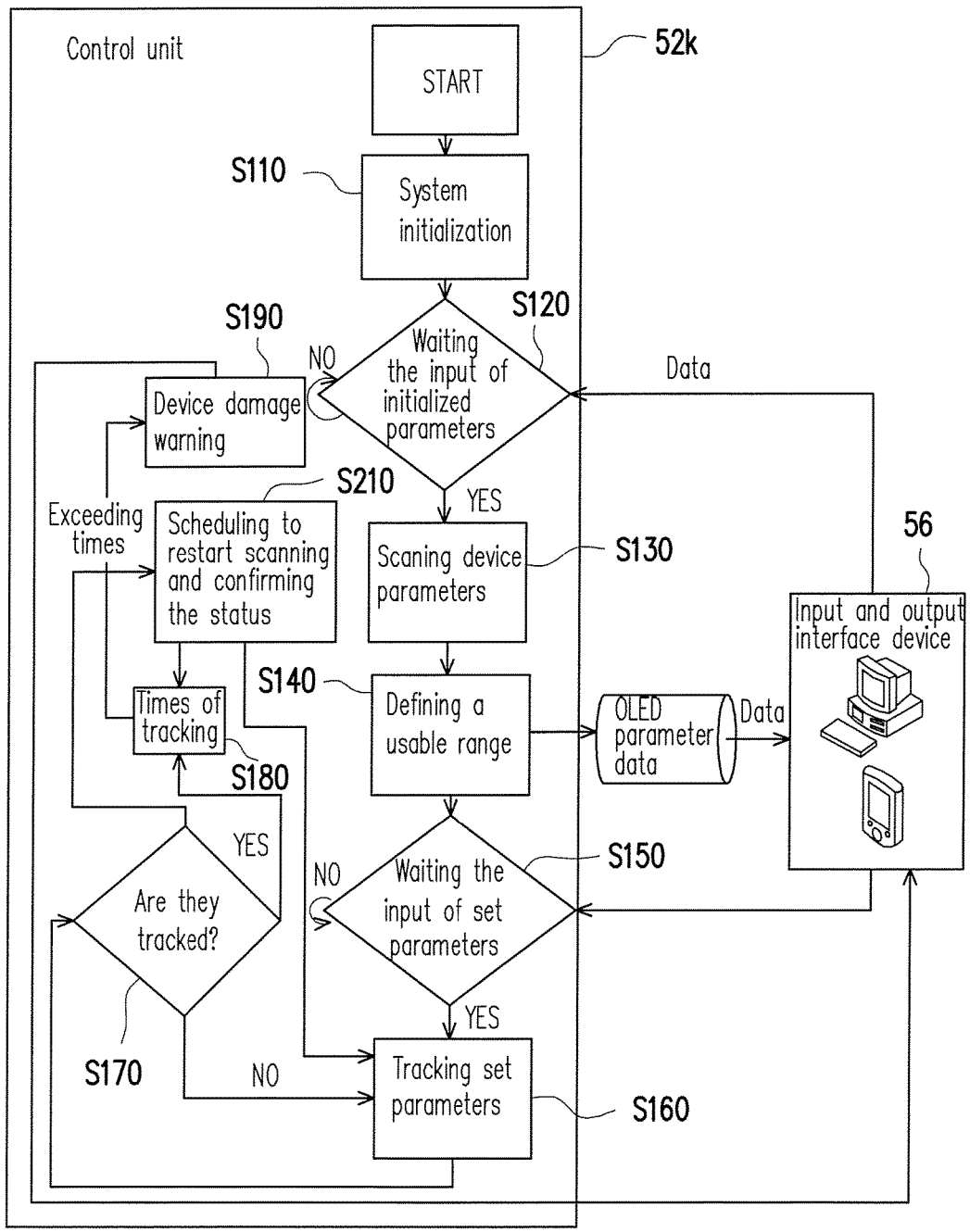
FIG. 19 is a schematic diagram showing the steps performed in the control unit in FIG. 15.

FIG. 19 is a schematic diagram showing the steps performed in the control unit in FIG. 15. Referring to FIGS. 15 and 19, when the control unit 52k is started up, the system setting is initialized (Step S110). Then, the input of initialized parameters is waited (Step S120). If the input and output interface device 56 inputs the data of initialized parameters (e.g. the upper and lower limits of voltage and current), the device parameters are scanned (Step S130) so as to obtain the aforementioned photoelectric parameter data. After that, a usable range of the device parameters, e.g. the CCT and the light intensity, is defined and output to the input and output interface device 56 (Step S140). The usable range of the device parameters may be the values corresponding to the aforementioned two end points of the OLED illumination module 100a or the values of Table 2. Then, the input and output interface device 56 displays the usable CCT and light intensity of the OLED illumination module 100a. Next, the input of set parameters is waited (Step S150). If the user inputs the aforementioned target values, e.g. the target CCT and the target light intensity by the input and output interface device 56, the input and output interface device 56 sends set parameters (i.e. the aforementioned target values) to the control unit 52k (Step S150), and the set parameters are tracked (Step S160). If the control unit 52k does not receive the set parameters, the control unit 52k continues waiting the input of the set parameters.

Then, whether the set parameters are tracked is determined (Step S170). If yes, times of tracking are counted (Step S180); if no, Step S160 is performed again. If the times of tracking exceed a predetermined number, device damage warning is performed (Step S190), and the message of the device damage warning is sent to the input and output interface 56 to notify the user. Moreover, to restart scanning and confirming the status of the OLED apparatus 50k is scheduled (Step S210), and the Step 160 is then performed, and times of tracking are counted (Step 180).

Figure 20:
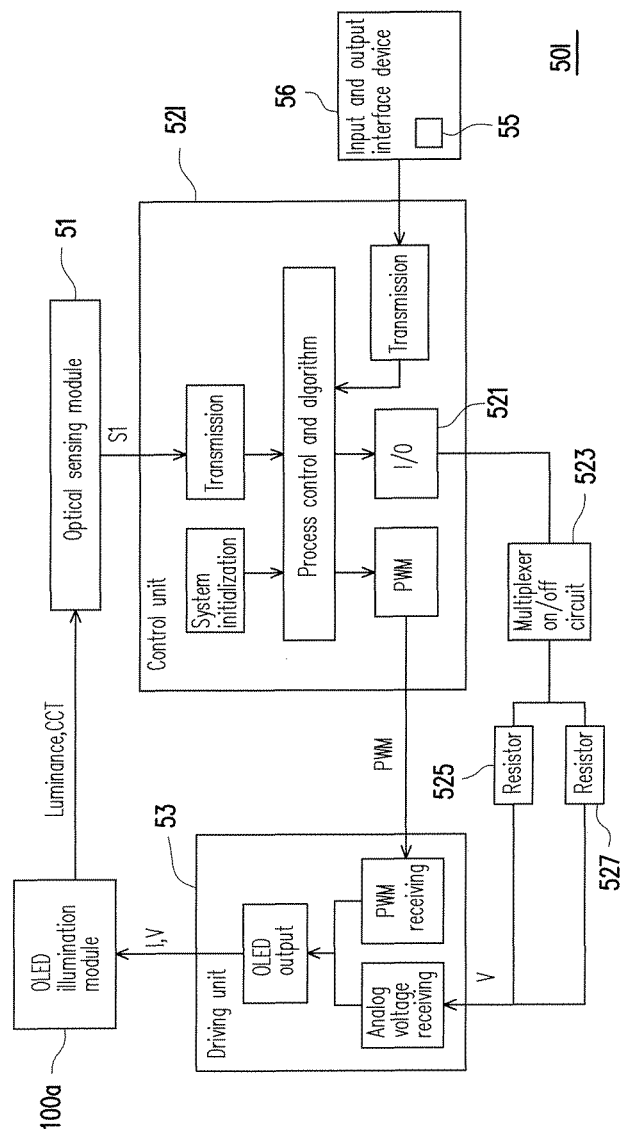
FIG. 20 is a schematic diagram of an OLED apparatus according to another embodiment of the disclosure.

FIG. 20 is a schematic diagram of an OLED apparatus according to another embodiment of the disclosure. Referring to FIG. 20, the OLED apparatus 50l in this embodiment is similar to the OLED apparatus 50k shown in FIG. 15, and the main difference therebetween is as follows. In the OLED apparatus 50l according to this embodiment, an input/output (I/O) port 521, a multiplexer 523, a resistor 525, and a resistor 527 are adopted to replace the digital-to-analog converter 522 in FIG. 15. In this embodiment, the control unit 521 may output an I/O signal to the multiplexer 523 so that the multiplexer 523 may selectively transmit the signal through the resistor 525 or the resistor 527. The resistance of the resistor 525 is different from that of the resistor 527, so that after the signal is selectively pass through one of the resistor 525 and the resistor 527, the voltage input to the driving unit 52 when the signal pass through the resistor 525 is different from the voltage input to the driving unit 52 when the signal pass through the resistor 527. As a result, by adjusting the I/O signal, the control unit 521 can determine which one of two voltages is input to the driving unit 53, so as to adjust the CCT of the OLED illumination module 100a.

Figure 21:
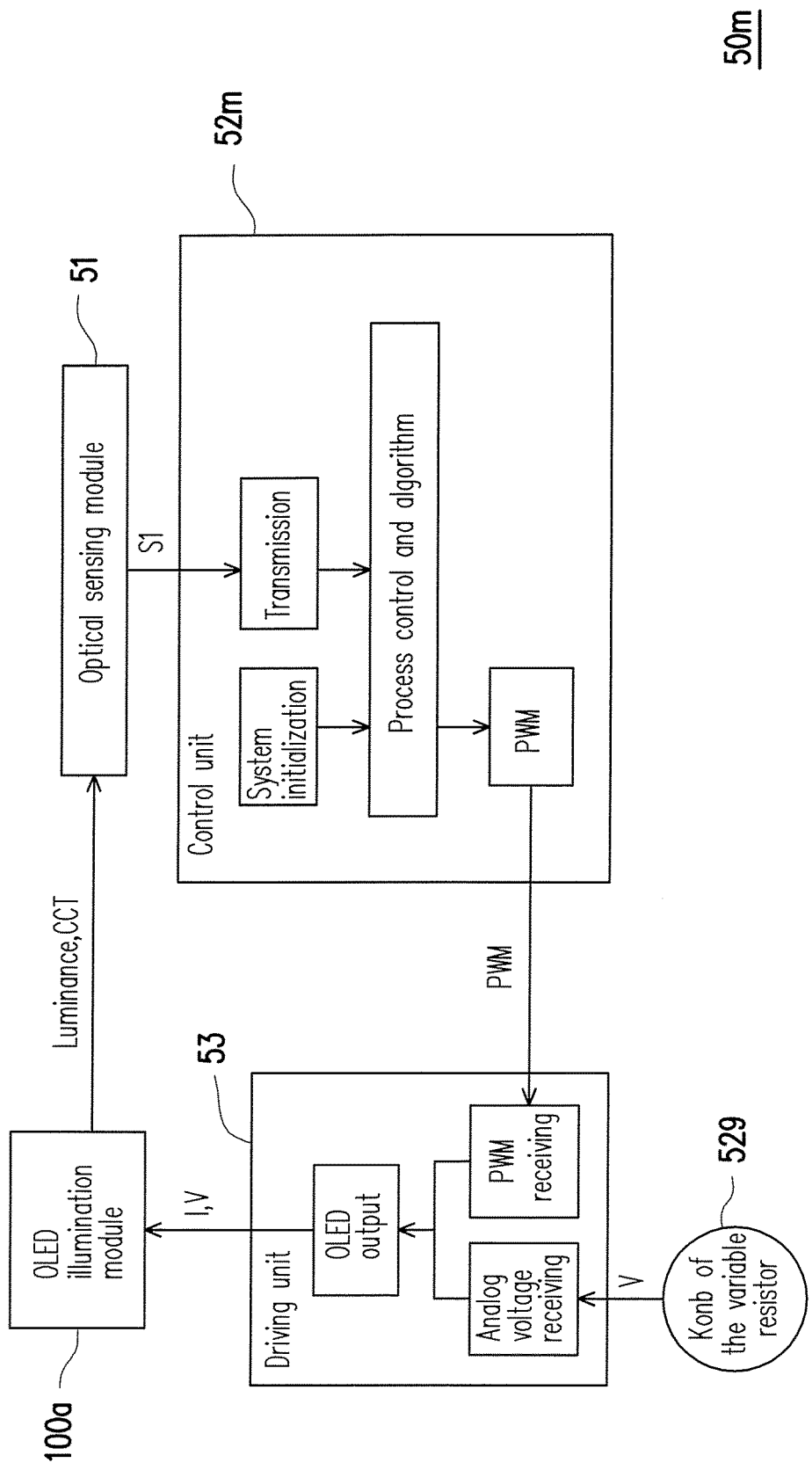
FIG. 21 is a schematic diagram of an OLED apparatus according to another embodiment of the disclosure.

FIG. 21 is a schematic diagram of an OLED apparatus according to another embodiment of the disclosure. Referring to FIG. 21, the OLED apparatus 50m in this embodiment is similar to the OLED apparatus 50k shown in FIG. 15, and the main difference therebetween is as follows. In this embodiment, the control unit 52m does not has the digital-to-analog converter 522 shown in FIG. 15, but the OLED apparatus 50m further includes a variable resistor 529 electrically connected to the driving unit 53. The user may change the resistance of the variable resistor 529 by, for example, rotating the knob of the variable resistor 529 to change the voltage input to the driving unit 53, so as to change the CCT of the illumination module 100a.

The OLED illumination module 100a in FIGS. 15, 20, and 21 may also be replaced by any one aforementioned illumination module of other embodiments, an OLED illumination module incapable of varying the CCT, or a plurality of OLED illumination module 100, 100a like FIGS. 13A to 13D.

In summary, in the OLED illumination module of the embodiments of the disclosure, the color temperature can be changed by the variation in the voltage difference applied to the first electrode and the second electrode, or by the second emitting layer, the hole transport layer capable of emitting light or the electron transport layer capable of emitting light at one side of the first emitting layer, so the applicability of the OLED illumination module is increased. In addition, in the OLED apparatus of the embodiments of the disclosure, in addition to adjusting the color temperature, the light intensity may also be adjusted through the PWM control unit, and thus the color temperature and the light intensity of the overall OLED apparatus can both be adjusted to meet the requirements, so the applicability of the OLED apparatus is increased. In the OLED apparatus according to the embodiments of the discloser, the storage unit is used to store photoelectric parameter data of the OLED illumination module, and the CCT and light intensity of the OLED illumination module is adjusted to target values according to the photoelectric parameter data. As a result, an OLED apparatus capable of adjusting the CCT and the light intensity is achieved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An organic light-emitting diode (OLED) apparatus, comprising:

at least one OLED illumination module;
a driver, electrically connected to the OLED illumination module and configured to adjust voltage applied to the OLED illumination module, so as to change a correlated color temperature (CCT) of light emitted by the OLED illumination module;
an optical sensor, configured to sense the light emitted by the OLED illumination module;
a controller, configured to receive a feedback signal from then optical sensor so as to adjust a light intensity and the CCT of the OLED illumination module, wherein the light intensity and the CCT of the OLED illumination module is adjusted by adjusting the voltage and a duty cycle of a pulse wavelength modulation (PWM) to the OLED illumination module; and
a storage, configured to store photoelectric parameter data of the OLED illumination module, the controller is configured to adjust the CCT and the light intensity of the OLED illumination module to target values according to the photoelectric parameter data, the photoelectric parameter data includes a relationship between at least two of voltage applied to the OLED illumination module, the CCT of the OLED illumination module, current applied to the OLED illumination module, and the light intensity of the OLED illumination module, wherein the photoelectric parameter data comprises a relationship at two end points of the voltage applied to the OLED illumination module or comprises a relationship in a table form having three or more voltages applied to the OLED illumination module.

2. The OLED apparatus as recited in claim 1, wherein the storage is integrated in the controller.

3. The OLED apparatus as recited in claim 1 further comprising an input and output interface device electrically connected or wirelessly connected to the controller, wherein the storage is integrated in the input and output interface device, and the input and output interface device comprises a computer or a portable computing device.

4. The OLED apparatus as recited in claim 1, wherein the controller is configured to calculate target values by interpolation based on a relationship.

5. The OLED apparatus as recited in claim 1, wherein the organic OLED illumination module comprises:
a first electrode;
a second electrode; and
an OLED layer stack, disposed between the first electrode and the second electrode, and comprising a first emitting layer and at least one of a hole injection layer, a hole transport layer, an electron injection layer, an electron transport layer and a blocking layer, wherein the OLED layer stack has an electro-optic characteristic, such that when a voltage difference between the first electrode and the second electrode is increased or decreased, both a light intensity and a correlated color temperature (CCT) of light emitted by the OLED layer stack are varied.

6. The OLED apparatus as recited in claim 5, wherein the first emitting layer is a white emitting layer, and the OLED layer stack comprises the hole transport layer capable of emitting light or the electron transport layer capable of emitting light, disposed at a side of the first emitting layer, so as to emit light having a main wavelength ranging from blue band to green band.

7. The OLED apparatus as recited in claim 6, wherein when the OLED layer stack comprises the hole transport layer capable of emitting light, a hole barrier between the hole transport layer capable of emitting light and the first emitting layer is less than 0.3 eV.

8. The OLED apparatus as recited in claim 6, wherein when the OLED layer stack comprises the electron transport layer capable of emitting light, an electron barrier between the electron transport layer capable of emitting light and the first emitting layer is less than 0.3 eV.

9. The OLED apparatus as recited in claim 5, wherein the first emitting layer is a white emitting layer, and the OLED layer stack further comprise a second emitting layer disposed at a side of the first emitting layer and is configured to emit light having a main wavelength ranging from blue band to green band.

10. The OLED apparatus as recited in claim 9, wherein the OLED layer stack comprises the hole transport layer and the electron transport layer, the first emitting layer and the second emitting layer are disposed between the hole transport layer and the electron transport layer, the first emitting layer comprises an emitting sub-layer for emitting blue light, the second emitting layer emits blue light, and a least driving voltage for the second emitting layer to emit light is higher than a least driving voltage for the emitting sub-layer for emitting blue light to emit the blue light by at least 0.5 volts.

11. The OLED apparatus as recited in claim 10, wherein the second emitting layer has an electron vibronic emission characteristic, and a light emission spectrum thereof has two peaks ranging from 450 nm to 475 nm and from 475 nm to 500 nm, respectively.

12. The OLED apparatus as recited in claim 5, further comprising
another OLED layer stack, disposed between the first electrode and the second electrode, and comprising a second emitting layer and at least one of a hole injection layer, a hole transport layer, an electron injection layer, an electron transport layer and a blocking layer, wherein the first emitting layer emits white light, and the second emitting layer emits light having a main wavelength ranging from blue band to green band or emits light having a main wavelength ranging from red band to yellow band; and
a charge generation layer, connected to the OLED layer stack and the another OLED layer stack.

13. The OLED apparatus as recited in claim 12, wherein a least driving voltage for the second emitting layer to emit light is greater than a least driving voltage for the first emitting layer to emit light by at least 0.5 volts.

14. The OLED apparatus as recited in claim 1, wherein the OLED illumination module comprises:
a first electrode;
a second electrode; and
an OLED layer stack, disposed between the first electrode and the second electrode, wherein the OLED layer stack comprising a first emitting layer and a blocking layer, the blocking layer being disposed at a first side of the first emitting layer, the OLED layer stack further comprising a second emitting layer, a hole transport layer capable of emitting light or an electron transport layer capable of emitting light disposed at a second side of the first emitting layer, wherein the first side is opposite to the second side, and a thickness of the first emitting layer ranges from 20 nm to 45 nm.

15. The OLED apparatus as recited in claim 14, wherein the first emitting layer is a white emitting layer.

16. The OLED apparatus as recited in claim 14, wherein when the OLED layer stack comprises the hole transport layer capable of emitting light, a hole barrier between the hole transport layer capable of emitting light and the first emitting layer is less than 0.3 eV.

17. The OLED apparatus as recited in claim 14, wherein when the OLED layer stack comprises the electron transport layer capable of emitting light, an electron barrier between the electron transport layer capable of emitting light and the first emitting layer is less than 0.3 eV.

18. The OLED apparatus as recited in claim 14, wherein the hole transport layer capable of emitting light or the electron transport layer capable of emitting light is doped with a dopant capable of emitting blue light, green light or a combination thereof.

19. The OLED apparatus as recited in claim 14, wherein the first emitting layer is a white emitting layer, and the OLED layer stack further comprise the second emitting layer for emitting light having a main wavelength ranging from blue band to green band.

20. The OLED apparatus as recited in claim 19, wherein the OLED layer stack further comprises the hole transport layer and the electron transport layer, the first emitting layer and the second emitting layer are disposed between the hole transport layer and the electron transport layer, the first emitting layer comprises an emitting sub-layer for emitting blue light, the second emitting layer emits blue light, and a least driving voltage for the second emitting layer to emit light is higher than a least driving voltage for the emitting sub-layer for emitting blue light to emit the blue light by at least 0.5 volts.

21. The OLED apparatus as recited in claim 20, wherein the second emitting layer has an electron vibronic emission characteristic, and a light emission spectrum thereof has two peaks ranging from 450 nm to 475 nm and from 475 nm to 500 nm, respectively.

* * * * *